United States Patent
Yamagishi et al.

(10) Patent No.: US 6,630,053 B2
(45) Date of Patent: Oct. 7, 2003

(54) SEMICONDUCTOR PROCESSING MODULE AND APPARATUS

(75) Inventors: Takayuki Yamagishi, Tama (JP); Masaei Suwada, Tama (JP); Takeshi Watanabe, Tama (JP)

(73) Assignee: ASM Japan K.K., Tama (JP)

( * ) Notice: Subject to any disclaimer, the term of this patent is extended or adjusted under 35 U.S.C. 154(b) by 42 days.

(21) Appl. No.: 09/932,790

(22) Filed: Aug. 17, 2001

(65) Prior Publication Data

US 2002/0036065 A1 Mar. 28, 2002

(30) Foreign Application Priority Data

Aug. 22, 2000 (JP) ........................ 2000-025145
Jun. 28, 2001 (JP) ........................ 2001-196802

(51) Int. Cl.⁷ .......................... C23C 16/00; H01L 21/00
(52) U.S. Cl. .................... 156/345.32; 118/719
(58) Field of Search .................... 156/345.32; 118/719, 118/729, 723, 715

(56) References Cited

U.S. PATENT DOCUMENTS

| | | | |
|---|---|---|---|
| 4,592,800 A | * 6/1986 | Landau et al. | 156/643 |
| 4,854,263 A | * 8/1989 | Chang et al. | 118/715 |
| 4,908,095 A | * 3/1990 | Kagatsume et al. | |
| 5,145,303 A | * 9/1992 | Clarke | 414/217 |
| 5,178,638 A | * 1/1993 | Kaneko et al. | 29/25.01 |
| 5,217,559 A | * 6/1993 | Moslehi et al. | 156/345 |
| 5,288,379 A | * 2/1994 | Namiki et al. | 204/192.12 |
| 5,306,380 A | * 4/1994 | Hiroki | 156/345.32 |
| 5,365,877 A | * 11/1994 | Kubota | 117/93 |
| 5,382,311 A | * 1/1995 | Ishikawa et al. | 156/345 |
| 5,405,230 A | * 4/1995 | Ono et al. | 414/217 |
| 5,433,784 A | * 7/1995 | Miyagi et al. | 118/715 |
| 5,458,685 A | * 10/1995 | Hasebe et al. | 118/724 |
| 5,685,942 A | * 11/1997 | Ishii | 156/345 |
| 5,730,801 A | 3/1998 | Tepman et al. | 118/719 |
| 5,755,888 A | * 5/1998 | Torii et al. | 118/719 |
| 5,855,681 A | 1/1999 | Maydan et al. | 118/719 |
| 5,909,994 A | * 6/1999 | Blum et al. | 414/217 |
| 5,980,684 A | * 11/1999 | Hori et al. | 156/345 |
| 6,016,611 A | * 1/2000 | White et al. | 34/92 |
| 6,024,800 A | * 2/2000 | Soejima et al. | 118/719 |
| 6,235,634 B1 | * 5/2001 | White et al. | 438/680 |
| 6,273,956 B1 | * 8/2001 | Cox | 118/719 |

FOREIGN PATENT DOCUMENTS

| | | |
|---|---|---|
| JP | 10-30183 | 2/1998 |
| JP | 10-154739 | 6/1998 |

* cited by examiner

*Primary Examiner*—Gregory Mills
*Assistant Examiner*—Michelle Crowell
(74) *Attorney, Agent, or Firm*—Knobbe Martens Olson & Bear LLP

(57) ABSTRACT

A compact single-wafer-processing semiconductor-manufacturing apparatus for processing semiconductor substrates is characterized in that at least two units, each of which comprises a reactor for growing a film on a semiconductor substrate and a load lock chamber for having the semiconductor substrate wait in a vacuum and which is directly connected with the reactor via a gate valve, are modularized and these modularized reactor units can be configured as a cluster through an atmospheric front end (AFE). Inside the load lock chamber, a substrate transfer mechanism comprising a thin link arm for transferring a semiconductor substrate into the reactor is provided.

28 Claims, 15 Drawing Sheets

IOC IN

PIN UP AND ARM OUT

RC IN

SUSCEPTOR UP

SEMICONDUCTOR PROCESSING MODULE AND APPARATUS

BACKGROUND OF THE INVENTION

1. Field of the Invention

The present invention relates to a semiconductor-manufacturing apparatus using a vacuum load lock chamber connected to a reactor, and it particularly relates to a semiconductor-manufacturing apparatus comprising compact free-layout single-wafer-processing units, its gas-line system, and the structure of a reactor.

2. Description of the Related Art

Generally, chambers of a semiconductor-manufacturing apparatus using a vacuum load lock system comprise a load lock chamber, a transfer chamber and multiple reactors (processing chambers) connected with the transfer chamber. For each chamber, a substrate-handling robot for automatically supplying substrates is used and it functions as described in the following: First, the atmospheric robot brings a substrate inside a load lock chamber from a cassette or a front opening unified pod ("FOUP", e.g., a detachable cassette and a box with a front-opening interface). After evacuating air into the load lock chamber, the substrate is transferred to each reactor by a vacuum robot provided inside a common polygon-shaped transfer chamber. The substrate processed in the reactor is transferred inside the load lock chamber by the vacuum robot. Lastly, after restoring atmospheric pressure inside the load lock chamber, the processed substrate is taken out to the cassette or the FOUP by the atmospheric robot. This type of apparatus is generally called a cluster tool.

Conventionally, there are two types of cluster tools, i.e., a single-wafer-processing type and a batch-based wafer processing type. With the single wafer processing type, each reactor processes one wafer at a time. With the batch-based wafer processing type, a single reactor processes multiple wafers at a time.

Because the batch-based wafer processing apparatus processes multiple sheets of substrates in a single reactor, its productivity is high. A thin film formed on a substrate by the batch-based wafer processing apparatus, however, is not uniform in thickness and quality and this often becomes a problem. To improve the uniformity of film thickness and quality, using a single-wafer-processing apparatus is effective.

If attempting to increase productivity using a conventional single-wafer-processing type apparatus, the number of reactors increases, the footprint (an area occupied by an apparatus) and faceprint (the width of an apparatus front panel) increase, and costs increase as well. This is because the conventional single-wafer-processing apparatus possesses a common polygon-shaped transfer chamber and reactors are attached to it, radiating in all directions. Additionally due to the number of sides of a polygon, the number of reactors or a layout is restricted. Furthermore, conventionally, each reactor independently possesses a gas line and a vacuum line, and independently performs deposition (film forming). If increasing the number of reactors to improve productivity, the number of vacuum elements increases because the same number of gas lines and vacuum pumps as the reactors is required. As a result, costs per reactor increase and at the same time the footprint increases.

Furthermore, in conventional single-wafer-processing semiconductor-manufacturing apparatus, a reactor has a one-layered structure, and placing and processing a substrate are performed inside the same chamber. Consequently, the capacity of a processing chamber is large, and an amount of reaction gas and time required for deposition and cleaning increase accordingly. To solve this problem, a method for reducing the capacity of a processing chamber by sealing a reactor after a wafer is transferred was reported (U.S. Pat. No. 5,730,801 or Japanese Patent Laid-open No. 8-172037). This method is a technique generally used for batch-processing vertical furnaces. If applying this method to single-wafer-processing reactors, the following problem occurs: Normally, for a susceptor inside a single-wafer-processing reactor, to create a space between a substrate and a susceptor so that end factors of a vacuum robot can get in and out when transferring a substrate, a substrate lift pin passing through the susceptor is provided for supporting a substrate temporarily. To perform sealing at the periphery of a susceptor, it is necessary to fill this through hole. For sealing up the hole, one approach using a substrate lift pin's own weight for this purpose was devised. It provides the lift pin with a flange which can seal the hole (U.S. Pat. No. 5,730,801 or Japanese Patent Laid-open No. 8-172037). This approach, however, is very unstable and has a risk wherein a leak may occur when sealing is not done properly, for example, if the pin is caught under some influence or if pressure inside a transfer chamber becomes higher than pressure inside a processing chamber.

Additionally, Japanese Patent Laid-open No. 10-30183 discloses an ashing apparatus including a transfer mechanism inside a load lock chamber connected to a processing chamber, which is characterized simply in that a handing unit holding a semiconductor substrate is loaded and unloaded to and from the processing chamber. According to the above structures, the footprint or faceprint can be reduced to a certain degree. However, a reduction of the footprint or faceprint is not satisfactory, and no consideration is given to improve process efficiency and productivity or to simplify a total system or scale-up apparatus. The above structure will be explained further later.

Further, Japanese Patent Laid-open No. 10-154739 (or U.S. Pat. No. 5,855,681) discloses a substrate-processing apparatus comprising (a) a load lock chamber, (b) a transfer chamber, (c) more than one reactors, each being connected to the transfer chamber and having multiple (virtually two) processing zones, and (d) a first substrate-handling member provided inside the transfer chamber. This apparatus includes multiple reactors but must include the transfer chamber as a platform common to the reactors in addition to the load lock chamber. A reduction of the footprint or faceprint cannot be achieved, and insufficient consideration is given to improve process efficiency and productivity or to simplify a total system or scale-up apparatus. The above structure will be explained further later.

SUMMARY OF THE INVENTION

Consequently, an object of the present invention is to provide a semiconductor-manufacturing apparatus that realizes low costs, a small footprint and a small faceprint.

Another object of the present invention is to provide a compact and free-layout semiconductor-manufacturing apparatus that can accommodate a range from small-quantity production to mass production.

Still another object of the present invention is to provide a semiconductor-manufacturing apparatus that realizes a stable process and high throughput.

Yet another object of the present invention is to provide a gas-line system which includes a gas line and a vacuum line, realizing labor reduction and low costs.

Further another object of the present invention is to provide a sealing mechanism for a reactor, which can securely seal a reaction zone of a processing chamber for treatment, which zone is defined by dividing the interior of the processing chamber using a simple structure or a another structure that can obtain the same effects as obtained using a seal.

The above objects are merely examples and do not limit the scope of the present invention. To achieve the above-mentioned objects, the present invention includes the following embodiments:

In an embodiment, a semiconductor processing module adapted to be connected to an atmospheric robot unit, comprises: (a) multiple single-wafer processing units disposed side by side, and (b) a gas supply system common to said multiple units. Each unit comprises: (i) a reactor for treating a semiconductor substrate, said reactor having a pressure control valve in a gas exhaust line; and (ii) at least one load lock chamber for transferring the semiconductor substrate into and from the reactor in a vacuum. The load lock chamber has a front end and a rear end, wherein the rear end is connected immediately to said reactor via a gate valve, and the front end is adapted to be connected to the atmospheric robot unit via a flapper valve. The load lock chamber comprises a vacuum robot having linked arms with one revolving shaft for transferring the semiconductor substrate into and from said reactor by straight movement through the gate valve, wherein gas flow of each reactor is controlled by the pressure control valve provided in each reactor. FIGS. 1(a)–1(c), 2(a)–2(d), 6, 7, and 11, for example, show this embodiment.

In the above, the pressure control valve may an auto pressure control (APC) adjustable butterfly valve.

In an embodiment, the load lock chambers may communicate with each other through a manifold connecting a lower portion of each load lock chamber, whereby vacuum operation is controlled as one load lock chamber. FIG. 13, for example, shows this embodiment.

In another embodiment, each unit can have two load lock chambers, wherein one chamber is placed on top of the other chamber, and one of the chambers transfers the semiconductor substrate into the reactor in a vacuum, whereas the other chamber transfers the semiconductor substrate from the reactor in a vacuum. FIG. 3, for example, shows this embodiment.

Regarding the gas supply system of the module, the gas supply system may be provided with a flow divider for supplying gas equally to each reactor, and further comprise a gas stop valve for each reactor between said flow divider and each reactor. The gas supply system may also be provided with a mass flow controller for each reactor. Regarding the gas exhaust system, the module may comprise a vacuum exhaust valve for each reactor between the pressure control valve and the reactor. The gas exhaust system may be common to the respective reactors, i.e., a single gas exhaust system. FIGS. 6, 7, and 11, for example, show these embodiments.

In an embodiment, the module may further comprises one RF generator and a switch for electrically connecting said RF generator and one of the reactors, wherein deposition and cleaning are alternately performed in the respective reactors. FIG. 7, for example, shows this embodiment.

Regarding the reactor, in an embodiment, it comprises: (a) a susceptor for placing a semiconductor substrate thereon; (b) a seal plate provided below and coaxially with said susceptor, said seal plate having a larger diameter than the susceptor and a seal surface along its periphery; (c) an elevating/descending device for moving said susceptor and said seal in a vertical direction; (d) a showerhead provided on a ceiling of said reactor for introducing gas; and (e) a duct member provided near said showerhead and having a circular projection formed along an inner wall of said reactor, wherein: (i) at a position where the susceptor and the seal plate elevate and the seal surface of the seal plate contacts the circular projection of the duct member, the interior of the reactor is divided by the seal plate into an upper reaction compartment and a lower compartment, in which reaction compartment a substrate on the susceptor is treated; and (ii) at a position where the susceptor and the seal plate descend, a substrate is transferred via the gate valve. FIGS. 8–10, for example, shows this embodiment.

In the above, the reactor may further comprise: (f) at least three substrate lift pins passing through said susceptor for supporting a substrate over said susceptor; (g) a disk for supporting said substrate lift pins, which is provided between the susceptor and the seal plate and coaxially with said susceptor, said disk having a diameter smaller than the seal plate but larger than the inner diameter of the circular projection; and (h) a floating elastic material having an upper end supporting said disk from its back and a lower end inserted in a recess formed in said seal plate, wherein when said seal plate is sealed to said circular projection of the duct member, said disk is also held by the circular projection to push said floating elastic material back in the recess of the seal plate, and said substrate lift pins descend to a position where the tip of each substrate lift pin is at a level the same as or lower than a susceptor surface. Further, the seal plate may be provided with a pressing elastic material for securing the seal between the seal surface of the seal plate and the circular projection (see FIG. 10, for example).

Additionally, the module may further comprises a susceptor height adjusting plate for adjusting the distance between the susceptor and the seal plate, thereby adjusting the distance between the showerhead and the susceptor when the susceptor and the seal plate elevate and the seal plate seals the circular projection of the duct. The susceptor height adjusting plate is installed along and coaxially with a susceptor shaft (see FIGS. 8 and 9, for example).

In another embodiment, the reactor may comprise: (a) a susceptor for placing a semiconductor substrate thereon; (b) an elevating/descending device for moving said susceptor in a vertical direction; (c) a showerhead provided on a ceiling of said reactor for introducing gas; (d) a duct member provided near said showerhead and formed along an inner wall of said reactor; and (e) a circular baffle plate provided on the inner wall of said reactor immediately below the duct member, wherein a gap is formed between the circular baffle plate and the duct member, said circular baffle plate having an inner diameter slightly smaller than the susceptor, wherein: (i) at a position where the susceptor elevates and is leveled with the circular baffle plate, the interior of the reactor is divided into an upper reaction compartment and a lower compartment, in which reaction compartment a substrate on the susceptor is treated, wherein an exhaust gas is discharged from the upper reaction compartment through the gap formed between the circular baffle plate and the duct member, and a shield gas is provided into the reaction compartment from the lower compartment through a gap formed between the susceptor and the circular baffle plate; and (ii) at a position where the susceptor descends, a substrate is transferred via the gate valve. FIGS. 12(a) and 12(b), for example, show this embodiment. In the above, the duct member and the baffle plate may be made of an insulation material.

In another aspect, the present invention provides a semiconductor processing apparatus comprising at least one module described above, and an atmospheric robot unit including an atmospheric robot for transferring a substrate into and from each reactor. See FIGS. 1(a)–1(c), 4, and 5, for example.

In the above, the atmospheric robot unit may have a sliding shaft in parallel to the load lock chambers, on which shaft the atmospheric robot slides to position in front of each load lock chamber. See FIGS. 4 and 5, for example. In the above, the multiple modules may be aligned side by side in a line (FIG. 4, for example), or the multiple modules may be disposed facing each other via a common atmospheric robot unit comprising an atmospheric robot for transferring a substrate into and from each load lock chamber (FIG. 5, for example).

In an embodiment, the apparatus may further comprise an atmospheric transport unit which is connected to the atmospheric robot unit and a loading port, wherein the atmospheric transport unit transfers a substrate or substrates between the atmospheric robot and the loading port. See FIG. 5, for example. In the above, the apparatus may include the loading port comprising a cassette and/or an inspection unit. Further, in an embodiment, the atmospheric transport unit may comprise: (a) a slot and an arm shaft for collectively transferring multiple substrates; (b) an elevating/descending shaft; and (c) a rotating shaft for transferring substrates between the loading port and the atmospheric robot, wherein said atmospheric transport unit collectively moves multiple substrates to a position where a substrate is transferred between the atmospheric transport unit and the atmospheric robot while the atmospheric robot does not slide on the sliding shaft.

In the present invention, various combinations of the elements described above can be adopted, and the present invention includes such various combinations.

For purposes of summarizing the invention and the advantages achieved over the prior art, certain objects and advantages of the invention have been described above. Of course, it is to be understood that not necessarily all such objects or advantages may be achieved in accordance with any particular embodiment of the invention. Thus, for example, those skilled in the art will recognize that the invention may be embodied or carried out in a manner that achieves or optimizes one advantage or group of advantages as taught herein without necessarily achieving other objects or advantages as may be taught or suggested herein.

Further aspects, features and advantages of this invention will become apparent from the detailed description of the preferred embodiments which follow.

BRIEF DESCRIPTION OF THE DRAWINGS

These and other features of this invention will now be described with reference to the drawings of preferred embodiments which are intended to illustrate and not to limit the invention.

Major symbols used in the figures are as follows: 1: Reactor; 2: Gate valve; 3: Load lock chamber; 4: Substrate transfer mechanism; 5: Atmospheric robot; 20: Semiconductor substrate; 21: Flapper valve; 22: Susceptor; 23': Substrate support pin

DETAILED DESCRIPTION OF THE PREFERRED EMBODIMENT

Figure 1A:
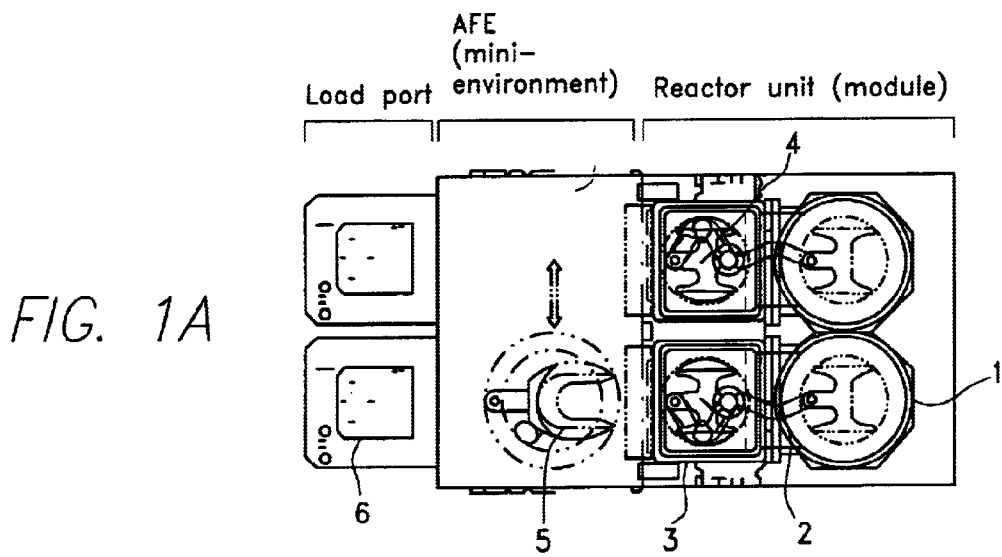
FIG. 1(a) shows a ground plan of a semiconductor-manufacturing apparatus according to the present invention.
Figures 1B, 1C:
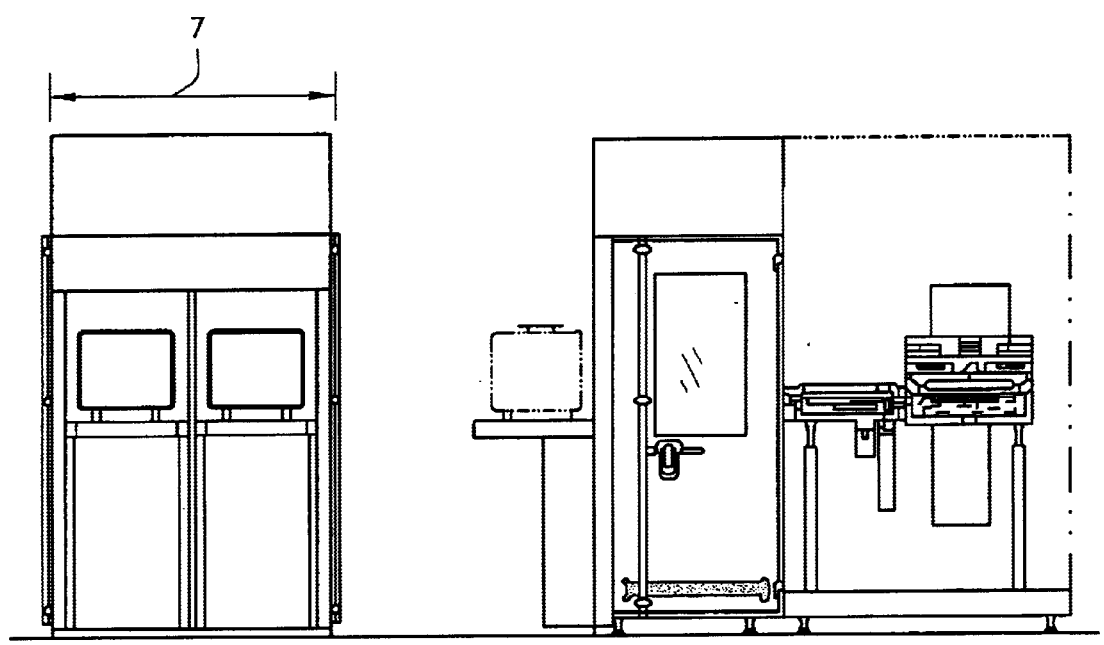
FIG. 1(b) shows the front view and FIG. 1(c) shows the side view.

The present invention is described below in detail referring to figures. FIG. 1 shows a compact single-wafer-processing semiconductor-manufacturing apparatus for forming a thin film on a semiconductor substrate according to the present invention. FIG. 1(a) shows the apparatus in ground plan, FIG. 1(b) shows it in a front view, and FIG. (c) shows it in a side view. The semiconductor-manufacturing apparatus comprises a modularized reactor unit which is describer later, an AFE (atmospheric front end) unit (A portion includes an atmospheric robot for bringing in and taking out a substrate inside a cassette or FOUP (front opening unified pod) 6 into a load lock chamber), and a load port unit in which the cassette or FOUP 6 is provided. The modularized reactor unit comprises two units by adjacently connecting them. Each unit comprises a reactor 1 for growing a film on a semiconductor substrate, a load lock chamber 3 for having the semiconductor substrate wait in a vacuum, which load lock chamber is directly connected to the reactor via a gate valve 2 and a substrate transfer mechanism provided inside the load lock chamber 3, which has one thin link arm shaft for transferring a semiconductor substrate inside the reactor and which moves a semiconductor substrate in a straight-line direction. In this embodiment, the load lock chamber 3 is one-layered in a vertical direction.

For link methods for an arm, there are several methods including a method having a wire or a timing belt built in the arm, a pantograph method, and a method having a guide installed externally for moving the arm in a straight line. The method having a wire or a timing belt built in the arm can reduce the size of arm in relation to the surface area of a semiconductor substrate. The pantograph method or the method having a guide installed externally has a large surface area, but is able to reduce the thickness of an arm.

For example, the above-mentioned built-in method comprises the first link, one end of which is rotatably and movably attached to a rotating shaft, the second link rotatably and movably attached to the other end of the first link with a pin, and a blade for placing a semiconductor substrate, which blade is rotatably and movably attached to the other end of the second link with a pin. Each pin and the rotating shaft are linked by a wire or a timing belt. The blade moves in a straight-line direction only by the rotation of the rotating shaft. The arm shaft, in which the blade moves in a straight line only by the rotating shaft, is called "one arm shaft".

By using a link arm in a substrate transfer mechanism 4, it is possible to accommodate the arm in a very compact manner. By reducing the thickness of the arm, dead space is further reduced. A link type robot is available from JEL Corporation, Hirosima, Japan (http://www.jel-robot.co.ip), such as #DVA170-01.

Figure 13:
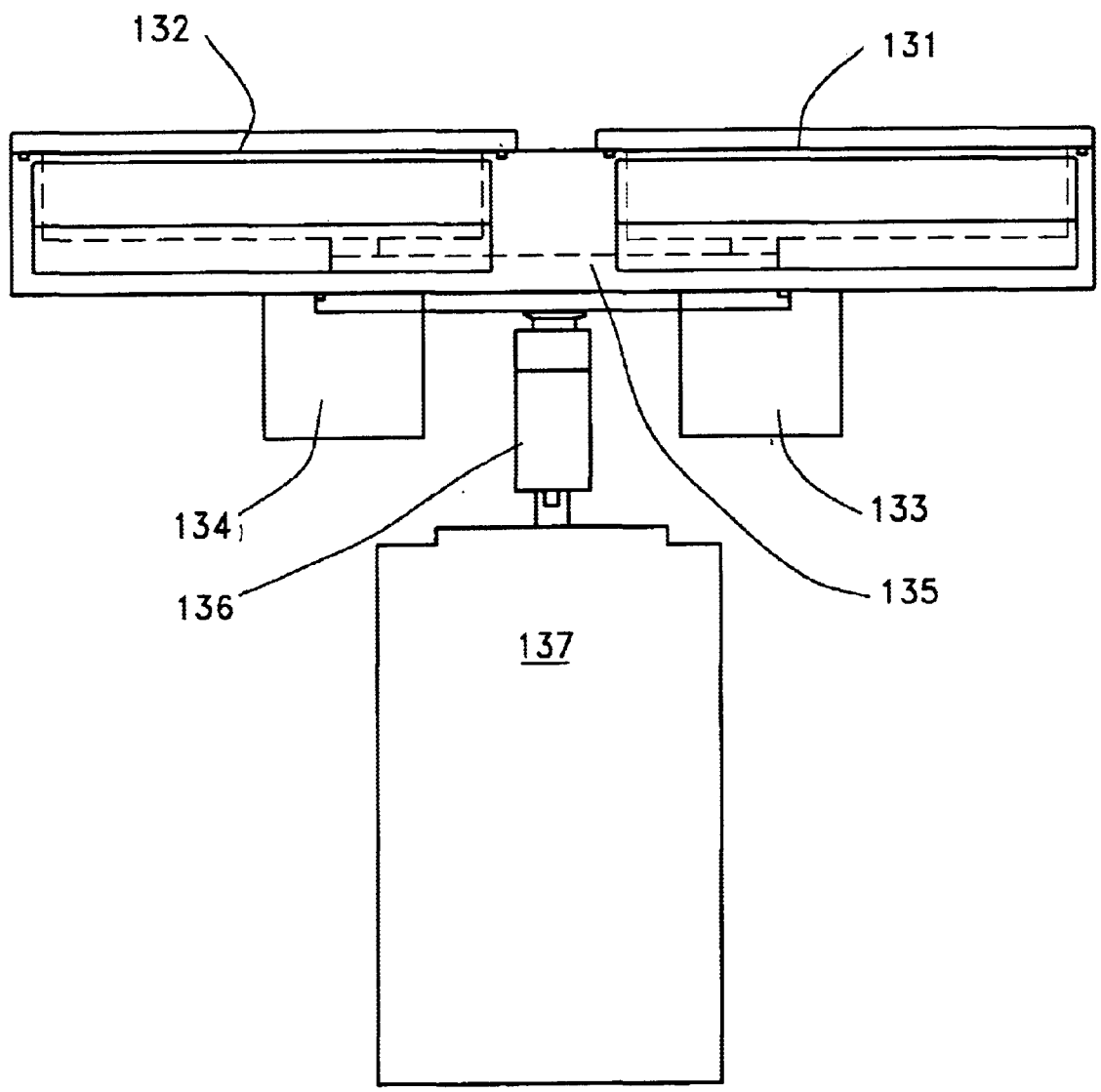
FIG. 13 shows a partial cross section of another embodiment of a semiconductor-manufacturing apparatus according to the present invention.

FIG. 13 shows a partial side view of another embodiment of a semiconductor-manufacturing apparatus according to the present invention. A portion with a dotted line shows a vacuum zone inside a chamber. As shown in FIG. 13, in this embodiment, two load lock chambers 131 and 132 appear to be adjacent, but each load lock chamber (131 and 132) are communicatively connected through a manifold 135 provided below the chambers, forming virtually one load lock chamber. Below the load lock chambers 131 and 132, rotary actuators 133 and 134 for driving each substrate transfer mechanism are provided. The manifold 135 is linked to a dry pump 137 through a vacuum exhaust valve 136 and piping, Thus, one load lock chamber is exhausted by one exhaust line.

By the embodiments described above, a small capacity of less than 101 can be realized even in the case of a load lock chamber accommodating a substrate with a diameter of 300 mm. As a result, it became possible to shorten the time required for vacuuming and restoring atmospheric pressure. Furthermore, by modularizing a reactor unit, it became possible to minimize dead space inside the reactor unit, reducing the faceprint 7 of the entire apparatus.

Figure 2A:
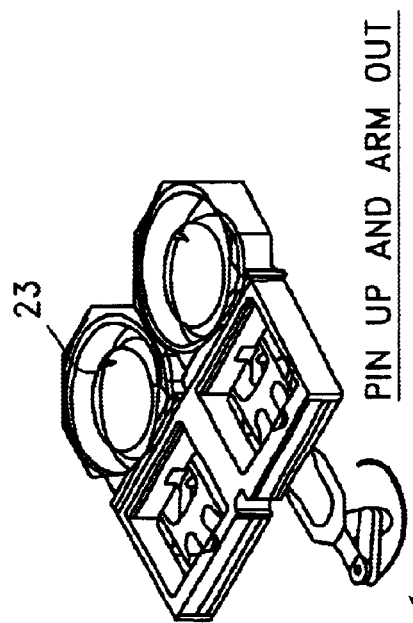
FIGS. 2(a) to (d) show the operation sequence of a semiconductor-manufacturing apparatus according to the present invention.
Figure 2C:
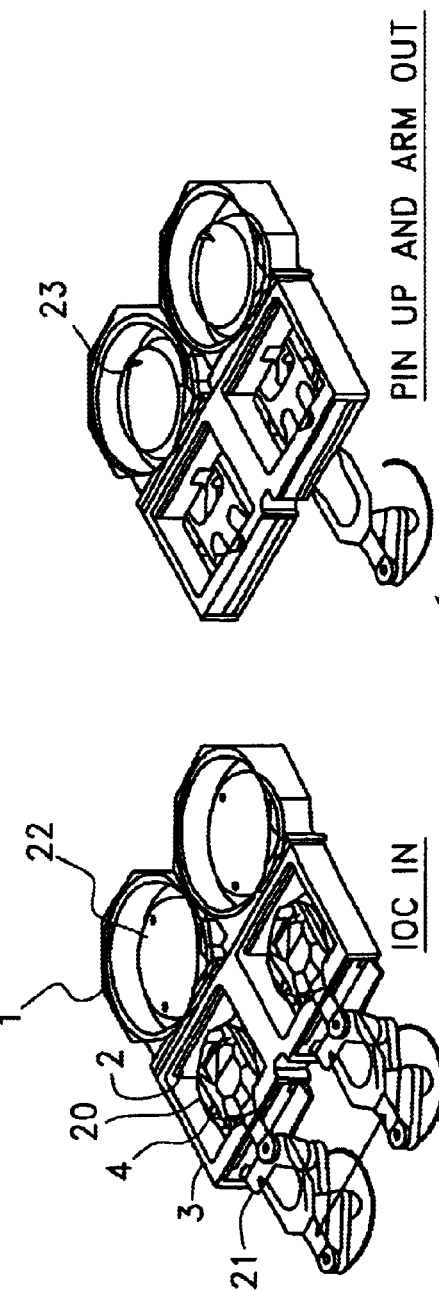
Figure 2B:
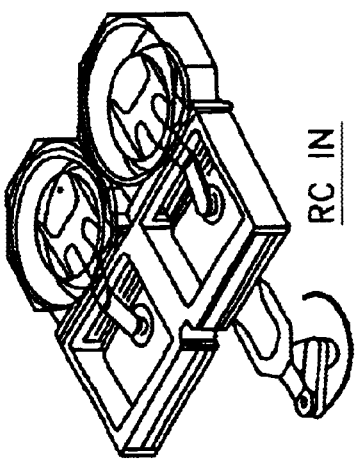
Figure 2D:
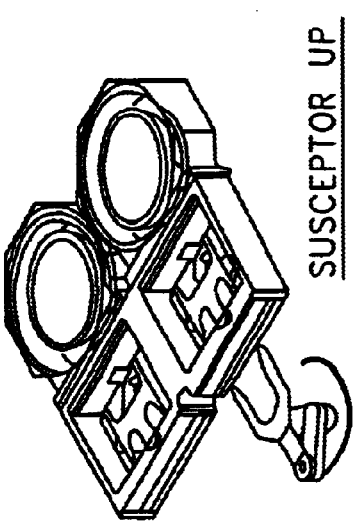

The operation of a semiconductor-manufacturing apparatus according to the present invention is described in the following: FIGS. 2(a) to (d) show an operation sequence of the apparatus. In FIG. 2, an atmospheric robot 5 brings a semiconductor substrate 20 inside each load lock chamber 3 from a cassette or an FOUP via a flapper valve 21. After bringing in the semiconductor substrate is has been brought in, the flapper valve 21 is closed and air inside the load lock chamber 3 is evacuated. In FIG. 2(b), a gate valve 2 is opened, and the semiconductor substrate is transferred onto a susceptor 22 inside a reactor 1 by a substrate transfer mechanism 4 having a thin-link type of arm. Because the substrate transfer mechanism 4 comprising the link arm only moves back and forth in a straight line between the load lock chamber and the reactor, adjustment by mechanical positioning is sufficient, eliminating complicate setting. In FIG. 2(c), a substrate support pin 23 protrudes from the susceptor surface, supporting the semiconductor substrate 20. The arm of the substrate transfer mechanism 4 is taken inside the load lock chamber and the gate valve 2 is closed. In FIG. 2(d), the susceptor 22 rises and the semiconductor substrate 20 is placed on the surface of the susceptor 22. Deposition on the semiconductor substrate 20, subsequently starts. After deposition is complete, by following the operation sequence conversely in the order of FIGS. 2(d)→(c)→(b)→(a), the processed semiconductor substrate is transferred to the cassette or the FOUP.

According to another embodiment according to the present invention shown in FIG. 13, because both load lock chambers are communicatively connected, they can be simultaneously evacuated and can transfer semiconductor wafers inside the reactors on the same timing. Consequently, two semiconductor wafers are simultaneously processed.

According to the present invention, because multiple substrates can be transferred simultaneously and at the same time deposition can be performed even using a single-wafer-processing system, throughput is high and a process is stable.

Figure 3:
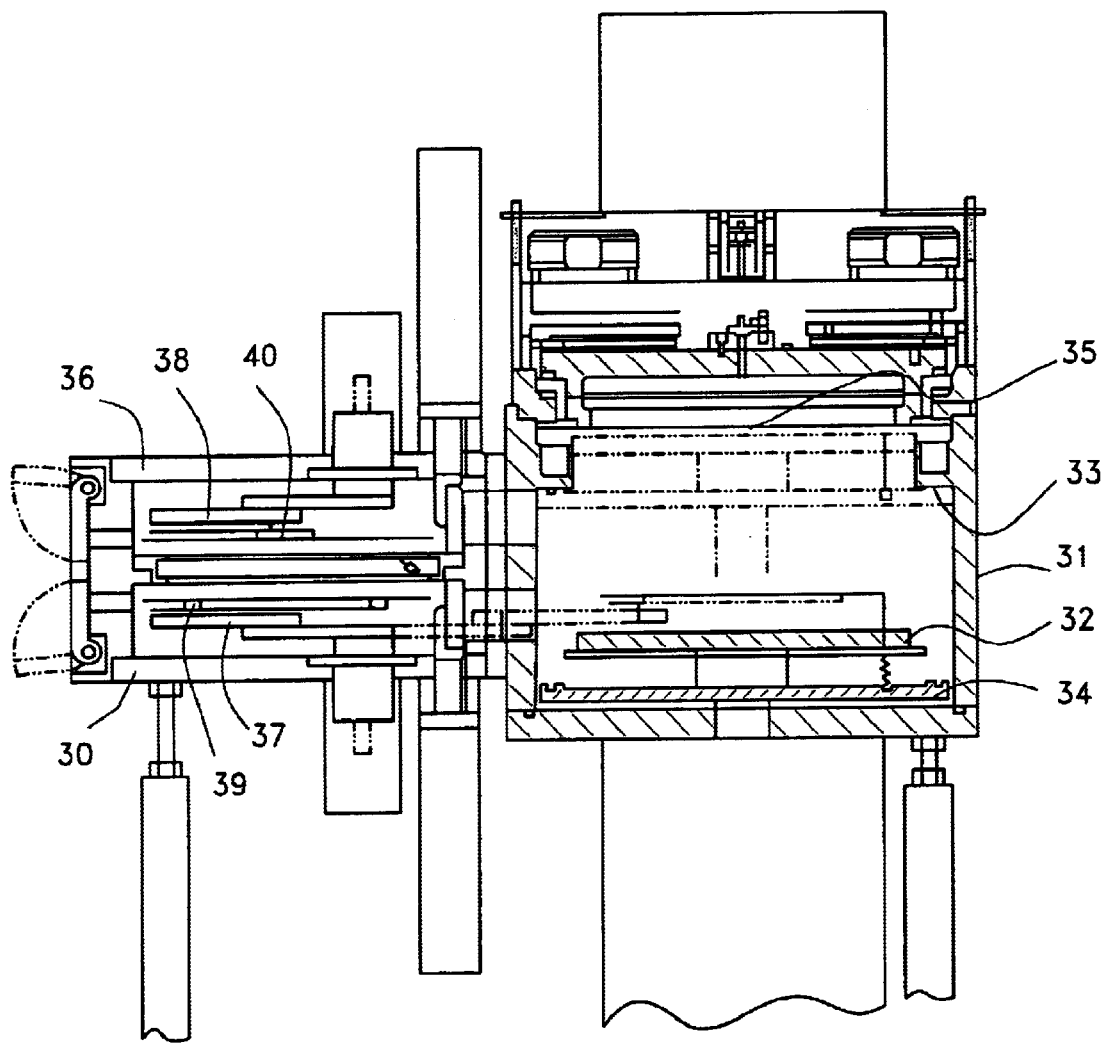
FIG. 3 shows a partial cross section of an embodiment in which load lock chambers shown in FIG. 1 are stacked in a vertical direction, forming a two-layer structure.

Embodiments of a semiconductor-manufacturing apparatus according to the present invention is described in the following: FIG. 3 shows a multiple-layered semiconductor-manufacturing apparatus in which two load lock chambers are placed one upon another vertically. As shown in FIG. 3, the apparatus comprises two levels of opposed load lock chambers 30 and 36, and one reactor 31 connected with the two-level load lock chambers 30 and 36. Inside each load lock chamber (30 and 36), substrate transfer mechanisms 37 and 38 are provided respectively. The lower substrate transfer mechanism 37 comprises a blade to which a pin 39 for placing a thin link arm and a substrate on, or guiding a thin link arm and a substrate, is attached. The lower substrate transfer mechanism supports a semiconductor substrate from the bottom after the substrate is placed on the pin 39 attached to the blade. Different from the lower one, the upper substrate transfer mechanism 38 has a blade and a presser foot stitch tongue 40 for supporting the semiconductor substrate from the top. In this embodiment, as described in detail below, the reactor 31 possesses a seal plate 34 for forming a narrow reaction zone 35 by contacting a seal surface 33 and a susceptor mechanism 32 capable of moving in a vertical direction.

Because this embodiment can process more substrates without increasing the faceprint and the footprint, throughput improves. Because each two-level load lock chamber independently possesses a substrate transfer mechanism, when one load lock chamber is being used, a semiconductor substrate is always in a waiting state inside the other load lock chamber. Consequently, the reactor can perform continuous processing without being restricted by substrate transfer time.

Figure 4:
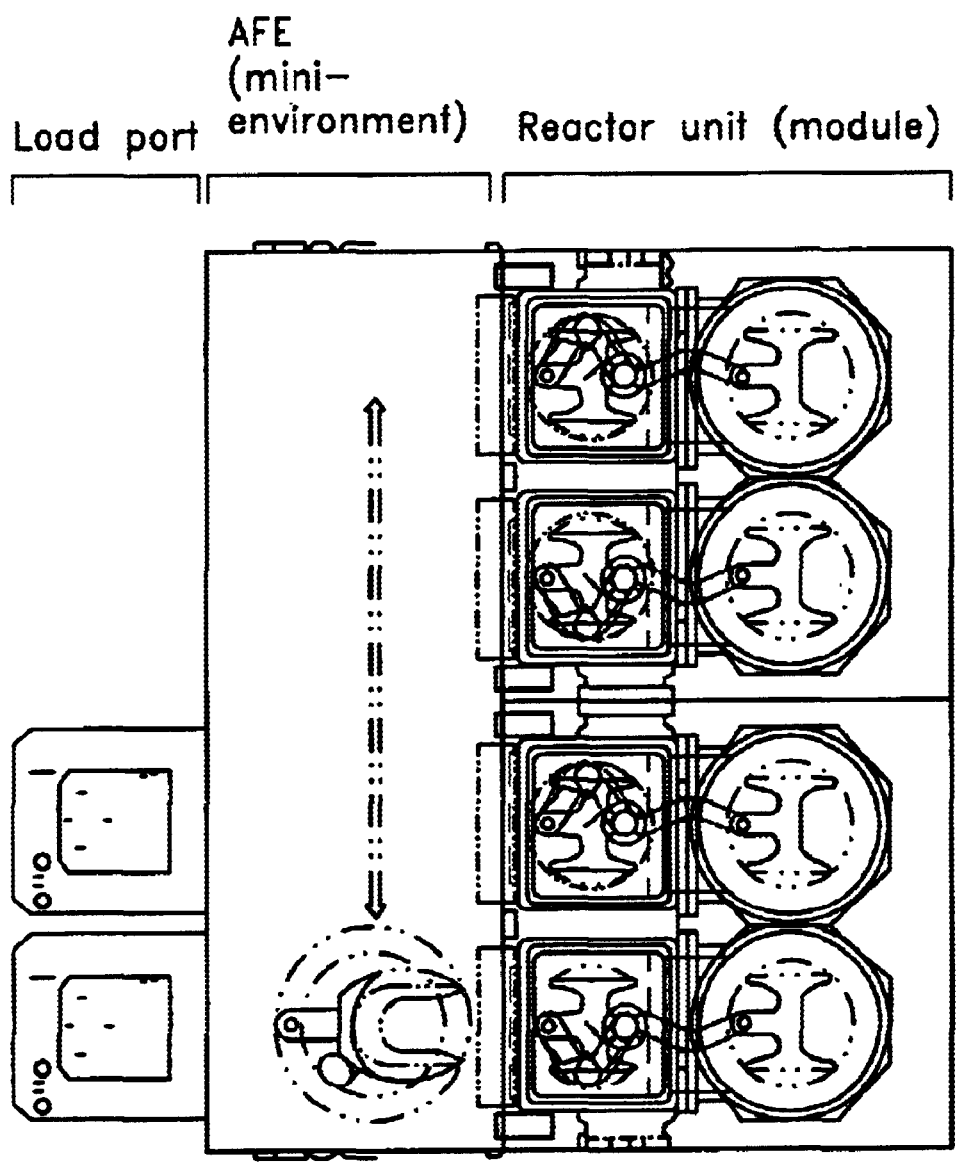
FIG. 4 shows a plane view of an embodiment in which two of the modules shown in FIG. 1 are linearly arranged in a horizontal direction.

FIG. 4 shows another embodiment of a semiconductor-manufacturing apparatus according to the present invention. As shown in FIG. 4, the apparatus comprises two modules connected linearly in a horizontal direction. An AFE is common to two modules. Any number of modules greater than two can be connected.

Because this embodiment can process many substrates at a time, throughput improves. With no restriction placed on the number of modules per apparatus, it can accommodate any scale of production from a small quantity to mass production. Particularly an embodiment having a low number of modules is effective because an increase in the faceprint is low.

Figure 5:
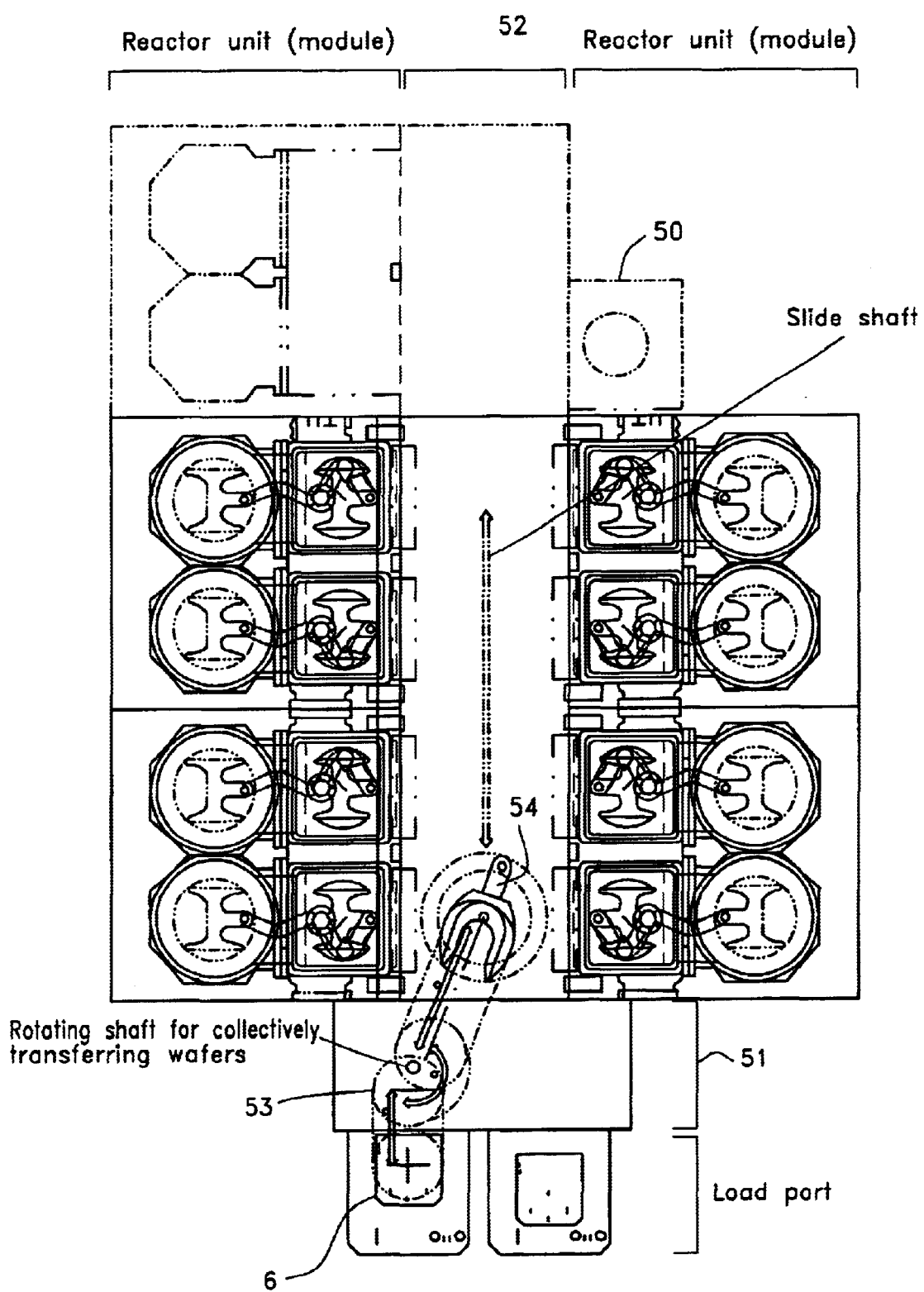
FIG. 5 shows a plane view of an embodiment in which linearly arranged modules are arranged facing each other.
Figure 14:
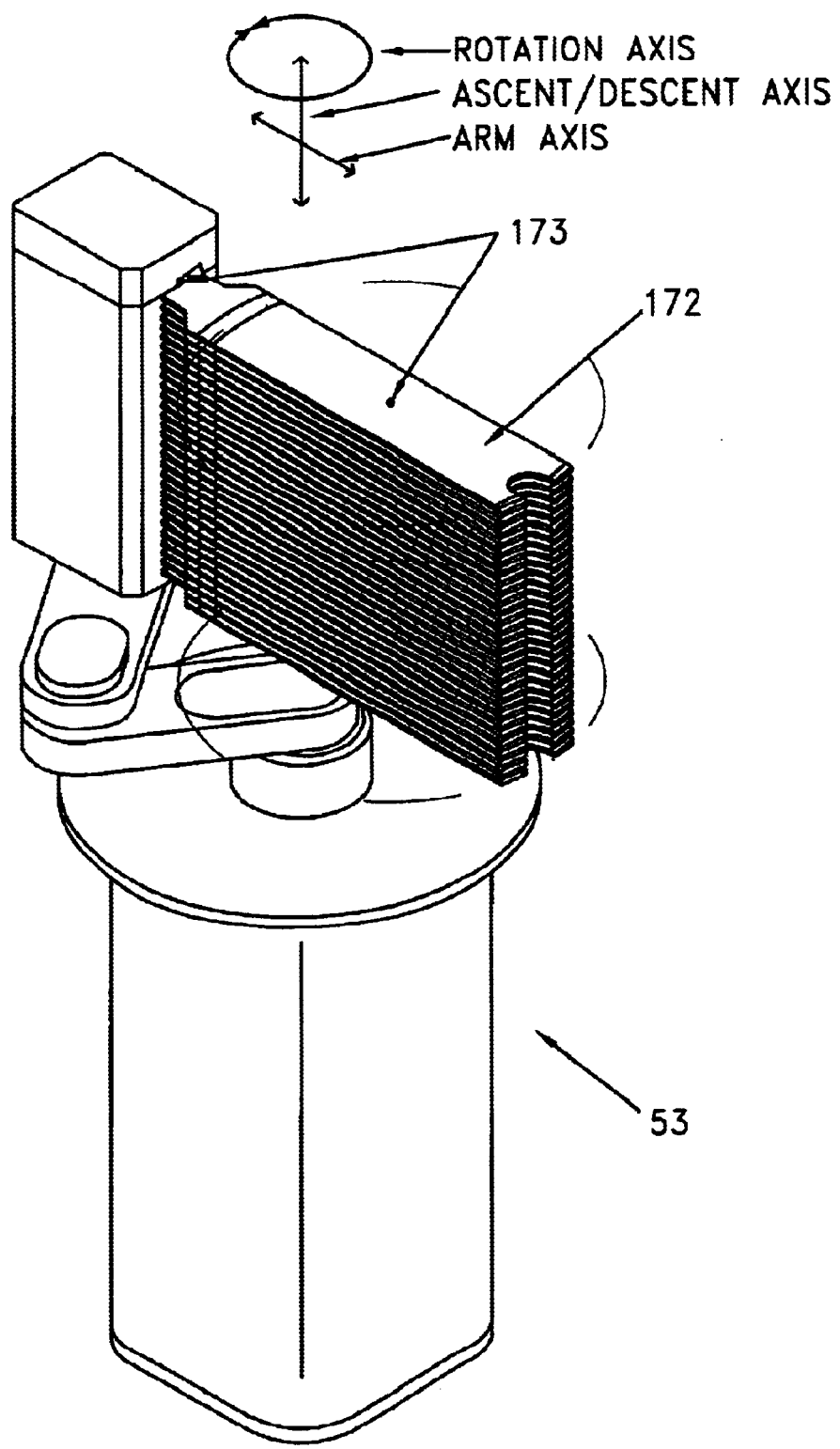
FIG. 14 shows an atmospheric robot which transfers wafers between a cassette or a FOUP (front opening unified pod) and another atmospheric robot for loading/unloading wafers in/from a reactor.

FIG. 5 shows another embodiment of a semiconductor-manufacturing apparatus. In this embodiment, two modules linearly connected in a horizontal direction are placed facing each other. An AFE is common to the four modules. Any number of modules more than two can be connected. In this embodiment, regardless of the number of modules connected, the faceprint is fixed. Additionally, an inspection device 50 for inspecting processed semiconductor substrates can also be connected. With this feature, an inspection process can be included between semiconductor substrate processes. In the apparatus shown in FIG. 5, an AFE comprises a first AFE unit 51 connected to a cassette or an FOUP and a second AFE unit 52 connected to each module. Inside the first AFE unit 51, the first atmospheric robot 53 with an arm shaft, an elevating shaft and rotating shaft, which comprises 25 substrate slots and a link arm, is provided. As shown in FIG. 14, this first atmospheric robot 53 collectively takes 25 substrates inside substrate slots 172 from the cassette or the FOUP 6 holding 25 sheets of substrates, and rotates around the rotating axis until it reaches a position from which it can deliver the substrates to the second atmospheric robot inside the second AFE unit 52. A sensor or sensors 173 are installed at each substrate slot, and configuration information of a substrate inside the cassette or the FOUP 6 ("mapping") is obtained. Inside the first AFE unit, multiple first atmospheric robots 53 can be arranged. The second atmospheric robot 54 can receive or deliver substrates from or to the first atmospheric robot 53 without a slide shaft.

The embodiment shown in FIG. 5 maintains the fixed faceprint and constitutes a free-layout module, enabling many substrates to be processed at a time and improving throughput. Because the first atmospheric robot does not possess a slide shaft, apparatus space and costs can be curbed. Additionally, due to sensors attached to substrate slots, mapping becomes easier and transfer time can be reduced. Furthermore, the first atmospheric robot can be used as a cooling stage for cooling a substrate heated by a reactor.

Figure 6:
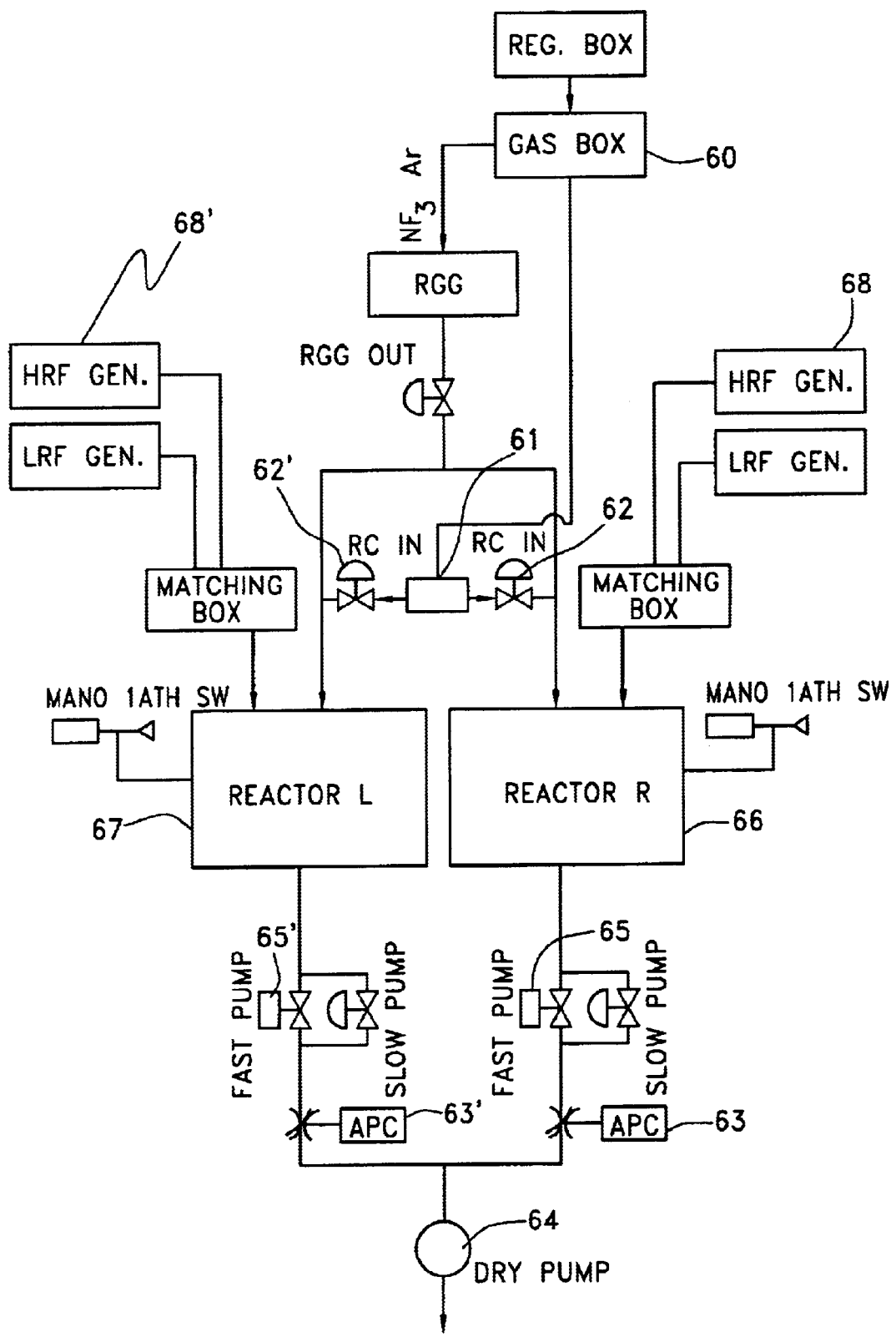
FIG. 6 shows an embodiment of a gas-line system used for a semiconductor-manufacturing apparatus which performs deposition simultaneously in two reactors.

A gas-line system of the semiconductor-manufacturing apparatus according to the present invention is described in the following: FIG. 6 shows a preferred embodiment of a gas-line system for reactors in a module according to the present invention. In the module according to the present invention, because deposition can be performed simultaneously on two semiconductor substrates, preferably it is desirable to provide one gas line and one exhaust line for two reactors. A gas line for reactors shown in FIG. 6 comprises one gas line which includes a gas source 60, a flow divider 61 connected with the gas source 60 for equally distributing source gas to two reactors after mixing the source gas supplied from the gas source 60, and gas stop valves 62 and 62' respectively connected between the flow divider 61 and each reactor (66 and 67), and one exhaust line which includes an exhaust pump 64, APCs (auto pressure control adjustable butterfly valves) (63 and 63') connected with the exhaust pump 64 and provided for each reactor (66 and 67), and vacuum exhaust valves 65 and 65' respectively connected between an APC and each reactor (66 and 67). The flow divider 61 has capability to output a gas flow of 0 to 10 SLM inputted to the primary side in equal amounts of 0 to 5 SLM to the secondary side. APC valves or exhaust throttle valves are available from MKS JAPAN, INC., Tokyo, Japan, such as #252E or #153F.

The operation of the embodiment shown in FIG. 6 is described in the following: Vacuum exhaust valves 65 and 65' are opened, air inside reactors 66 and 67 is evacuated by a vacuum pump 64 and semiconductor substrates are loaded. Gas stop valves 62 and 62' open and source gas is brought inside the reactors. At this time, with a combination of the flow divider 61 and APCs 63 and 63', an equal amount of source gas is respectively brought inside each reactor (66 and 67). High-frequency voltage is applied to semiconductor substrates inside the reactors by RF generators 68 and 68', producing a film-forming reaction inside both reactors.

In the embodiment shown in FIG. 6, pressure is controlled by an APC for each reactor and gas inside each reactor is discharged using a single pump. By using this independent pressure control and the above-mentioned flow divider, deposition can be independently controlled in the same manner as using one gas line per reactor and an individual difference between processing chambers can be coped with. Additionally, because each reactor possesses a gas stop valve and a vacuum exhaust valve, processing can be performed using only one reactor. Furthermore, because a gas-line system comprises one gas line and one exhaust line for two reactors, labor reduction and lower costs can be achieved.

Figure 11A:
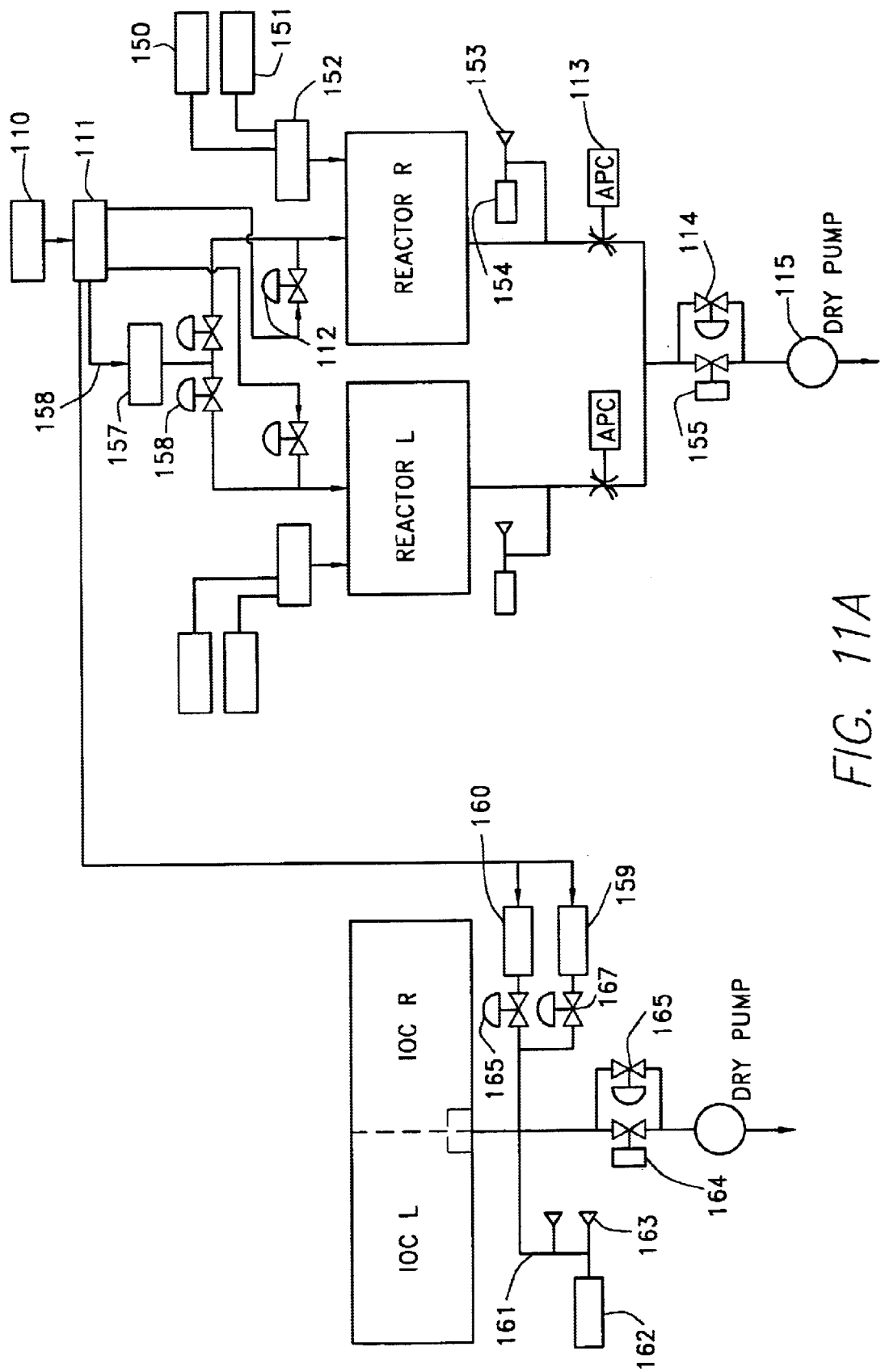
FIG. 11(a) shows another gas-line system according to the present invention.
Figure 11B:
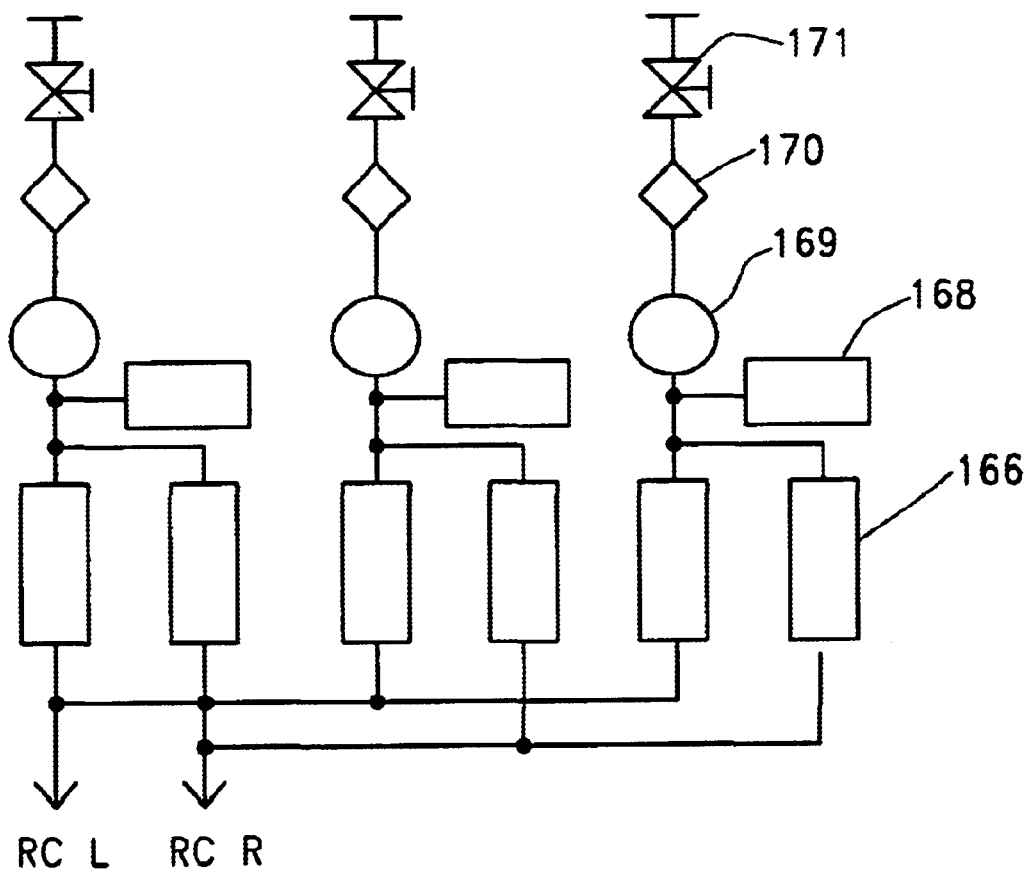
FIG. 11(b) shows a gas supply system for the reactor provided in a gas box 111 in FIG. 11(a).

Another gas-line system according to the present invention is described in the following: FIG. 11(a) shows a gas-line system used for another embodiment. In this embodiment, because deposition can be performed simultaneously on two wafers, it is preferred to provide one gas line and one exhaust line for two reactors. A gas line for reactors comprises one line until it reaches a regulator box 110 and a gas box 111. A gas line branches off inside the gas box 111. A gas stop valve 112 is provided for each reactor. For an exhaust line, an APC (auto pressure controller) 113 and a vacuum gauge (not shown) are provided for each reactor and an exhaust valve 114 and a dry pump 115 are common to each reactor. FIG. 11(b) shows a gas supply system for Reactor L and Reactor R provided in the gas box 111. This figure shows three gas inlets, for example. Gas is supplied to each reactor via a manual stop valve 171, a gas filter 170, a pressure regulator 169, a pressure transducer 168, and an MFC (mass flow controller) 166.

In this embodiment, pressure is individually controlled by an APC 113 for each reactor and gas inside each reactor is discharged using a single pump (dry pump 115) provided with a fast pump valve 155 and a slow pump valve 114. A monometer 154 and a one-atom switch 153 is provided between the each reactor and the APC 113. Gas supply is controlled by an MFC for each reactor. A combination of the APC and the MFC independently can control deposition in the same manner as using one gas line per reactor. Additionally, because each reactor possesses a gas stop valve 112, processing can be performed using only one reactor, and labor reduction and lower costs can be achieved. Further, a gas (NF3, Ar) 158 is supplied from the gas box 111 to both Reactor L and Reactor R through an RGG (reactive gas generator) 157 and an RGG OUT valve 156. RF power is exerted on each reactor by mixing RF from a high radio frequency generator 150 and RF from a low radio frequency generator 151 using a matching box 152.

Additionally, FIG. 11 indicates a gas flow system in connection to a load lock chamber, which system is connected to the gas box 111. In the figure, "IOC" (input-output chamber) is a load lock chamber. The gas flow system of the load lock chamber comprises similar elements to those used in the reactor. That is, gas is supplied from the gas box 111 to a flow meter 160 provided with a backfill valve 165 in parallel to a mass flow controller 159 provided with an N2 pump valve 167. The load lock chambers (IOC L and IOC R) are evacuated using a dry pump through a slow pump valve 165 and a fast pump valve 164. In order to control gas flow, an over pressure switch 161, a crystal gauge 162, and a one atom switch 163 are provided in the gas flow system.

Figure 7:
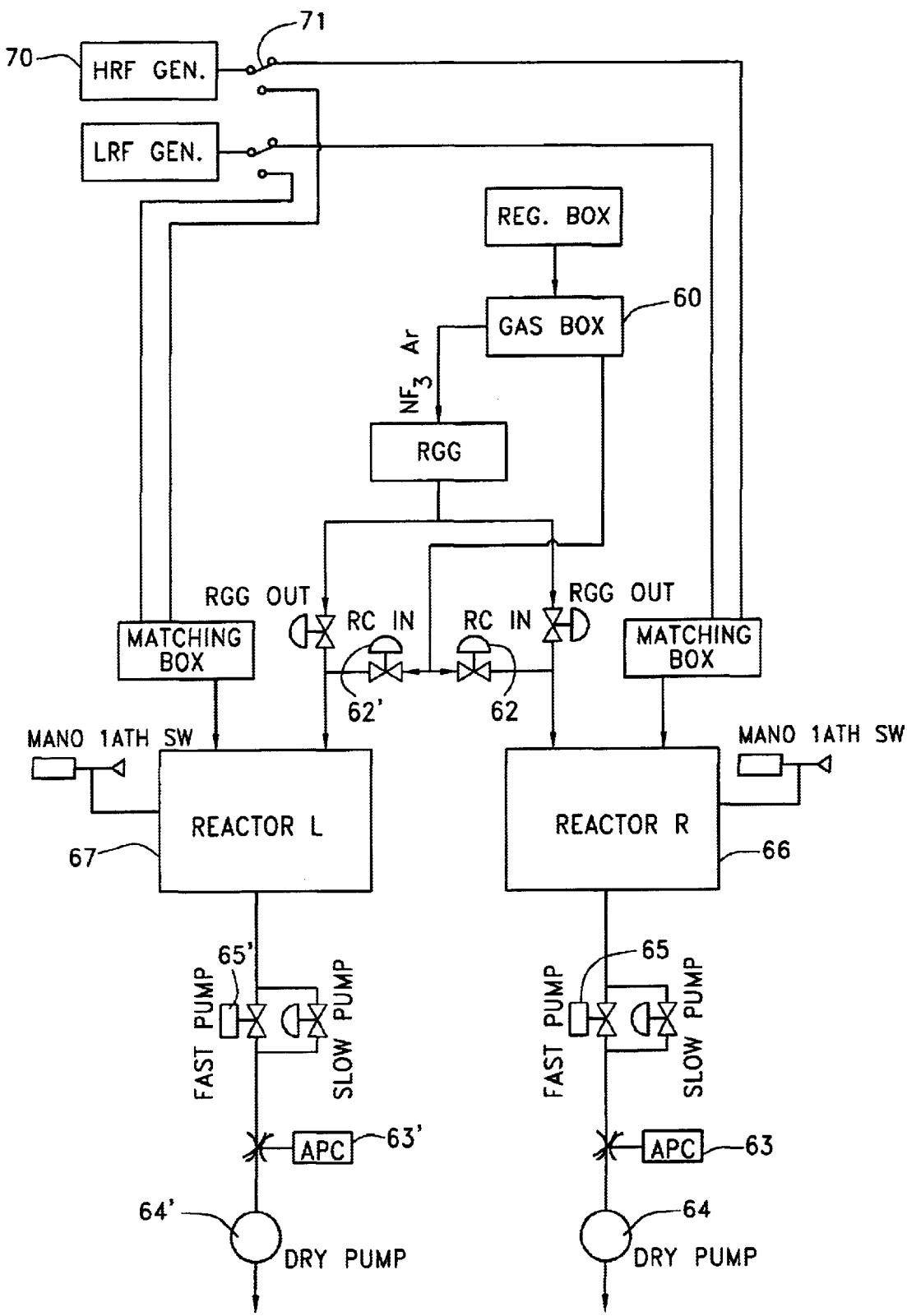
FIG. 7 shows an embodiment of a gas-line system used for a semiconductor-manufacturing apparatus, which alternately performs deposition and cleaning in two reactors.

FIG. 7 shows a variation of the embodiment shown in FIG. 6. In the embodiment shown in FIG. 7, an electrical and gas line system comprises one RF generator, one gas line and two exhaust lines for two reactors. The gas-line system for two reactors shown in FIG. 7 comprises one gas line which includes a gas source 60, and gas stop valves 62 and 62' provided for each reactor respectively, and connected between the gas source 60 and each reactor (66 and 67), and two exhaust lines which include exhaust pumps 64 and 64', APCs 63 and 63' provided for each reactor respectively, and connected with the exhaust pumps 64 and 64' and vacuum exhaust valves 65 and 65' provided for each reactor respectively, and connected between the APC and each reactor. Switched by a switching means 71, an RF generator 70 is electrically alternately connected with each chamber (66 and 67).

The operation of the variation shown in FIG. 7 is described in the following: Vacuum exhaust valves 65 and 65' are opened and air inside the reactors 66 and 67 are evacuated by exhaust pumps 64 and 64'. First, the gas stop valve 62 for a reactor (for example, 66) to be used for deposition opens and a source gas is brought inside the reactor 66. High-frequency voltage is applied to a semiconductor substrate inside the reactor 66 by the RF generator 70 switched by the switching means 71 so as to be connected with the reactor 66, and a film-forming reaction occurs. An RGG OUT valve for a reactor (67, for example) to be cleaned opens, a cleaning gas is brought inside the reactor 67, and an etching reaction occurs inside the reactor 67. In the embodiment shown in FIG. 7, in this way, cleaning and deposition are performed in the respective reactors at the same time.

In the embodiment shown in FIG. 7, cleaning and deposition can be alternately performed by alternately bringing substrates into and out from two reactors by switching the RF generator 70 and the gas stop valves 62 and 62'. Additionally, since this system comprises one RF generator and one gas line for two reactors, labor reduction and lower costs can be achieved.

Figure 8:
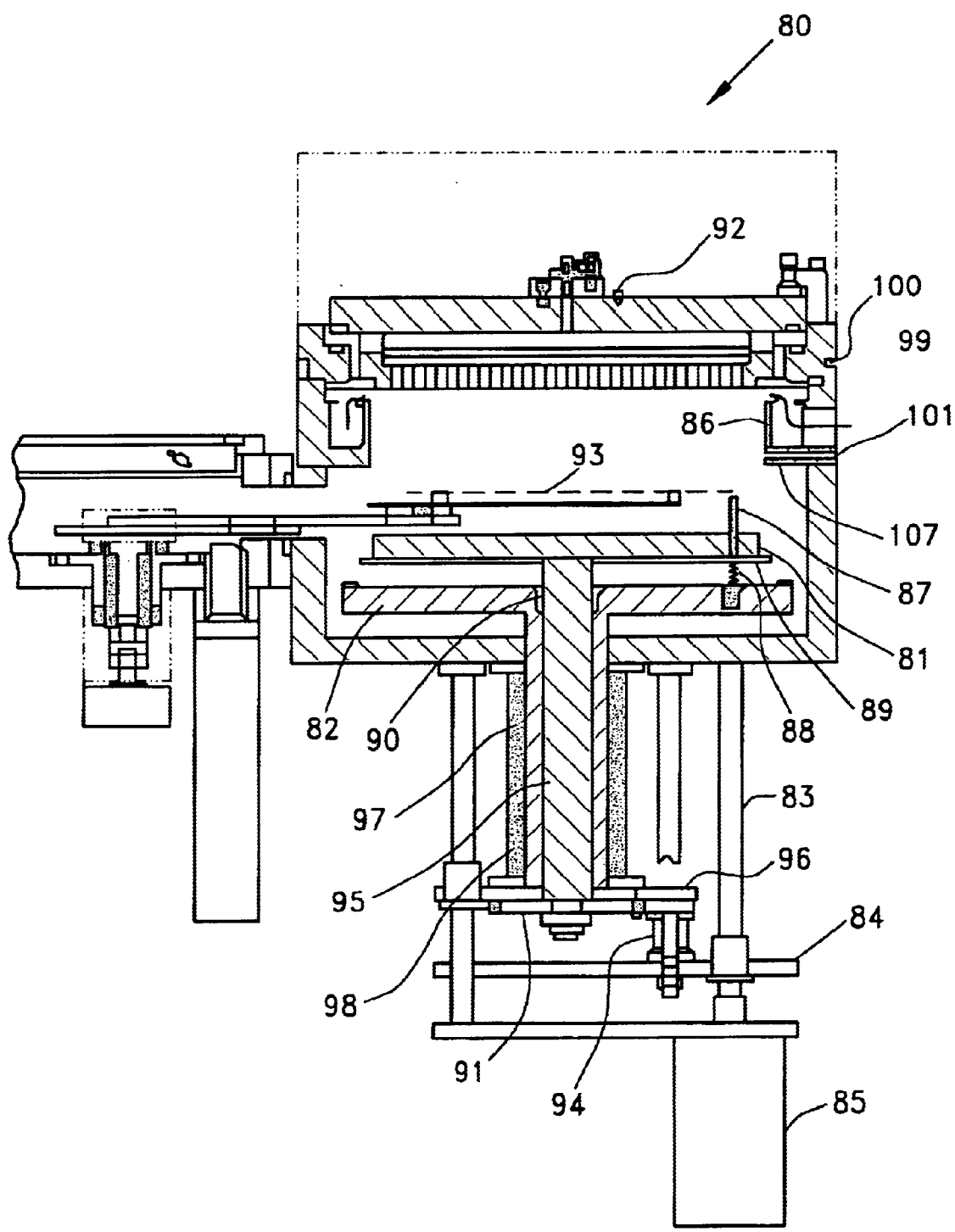
FIG. 8 is a schematic cross section of a reactor unit according to the present invention, depicting t a semiconductor substrate being transferred.

Lastly, a reactor unit according to the present invention is described in the following: FIG. 8 shows a preferred embodiment of a reactor unit according to the present invention. A reactor unit 80 for processing substrates sheet by sheet comprises a susceptor 81 for placing a semiconductor substrate 93 on, a seal plate 82 provided below the susceptor 81 and sharing the same shaft with the susceptor, elevating means 83, 84 and 85 for moving the susceptor 81 and the seal plate 82 in a vertical direction, a showerhead 92 for bringing in gas provided on the ceiling of the reactor 80, a duct means 86 with a seal surface 10 on its bottom surface, which is provided near the showerhead 92 and circularly along the surface of an internal wall of the reactor, a disk 89 provided between the susceptor 81 and the seal plate 82 and sharing the same shaft with the susceptor 81, a substrate lift pin 87 passing through the susceptor 81, which is supported by the disk 89, a floating elastic material 88 having one end engaged with the disk 89 and the other end attached to a concave portion provided on the seal plate 82, a susceptor shaft 95 for supporting the susceptor 81, which shaft 95 extends in a vertical direction, a cylindrical shaft 97 for supporting the seal plate 82, a susceptor interval-adjusting plate installed at the lower end of the susceptor shaft 95, a slide table 96 for transmitting thrust produced by elevating means 83, 84 and 85 to the cylindrical shaft 97, which is provided the lower end of the cylindrical shaft 97, and a pressing elastic material 94 for transmitting thrust produced by the elevating means to the slide table 96, which material 94 is provided between the slide table 96 and the elevating plate 84.

The radius of the seal plate 82 is larger than that of the susceptor 81 and its periphery protrudes upward. Preferably, an O-ring seal is provided on this protruding portion and the seal plate 82 is sealed up with a seal surface 107 at the bottom surface of the duct means 86. The concave portion on the surface of the seal plate 82 is provided to take in the floating elastic material 88 in a sealed position. For the floating elastic material 88, other elastic materials comprising preferably a spring can also be used. Alternatively, any number of floating elastic materials more than one can be used.

The disk 89 comprises a thin disk and its radius is larger than that of the susceptor 81 and smaller than that of the seal plate 82. In a sealed position, the disk 89 is held by the seal surface 107 of the duct means 86 and the seal plate 82 (See FIG. 10).

An elevating means comprises a ball screw 83, an elevating plate 84 and a driving means 85. The driving means 85 is preferably a pulse motor, but other means can also be used. Additionally, in addition to a combination of the ball screw 83 and the driving means 85, a pneumatic cylinder can also be used.

The susceptor shaft 95 passes through the inside of the cylindrical shaft 97. Near an opening at the top of the cylindrical shaft 97, an O-ring seal 90 is provided. The exterior of the cylindrical shaft 97 is covered by bellows 98. The bottom end of the susceptor shaft 95 is attached to the susceptor interval-adjusting plate 91. Intervals and levels between the showerhead 92 and the semiconductor substrate 93 can be adjusted independently of the seal plate 82.

The duct means 86 comprises a gas passage 100 for exhausting gas inside a processing chamber, which is described below, and an inactive (or inert) gas inlet port 101 for bringing in inactive gas to prevent a reaction gas from flowing in a lower portion from the susceptor surface during the deposition. The gas inside the processing chamber is exhausted from an exhaust port 99 provided on the side wall of the reactor after passing through the gas passage. Inactive gas (preferably, argon gas) is brought into the processing chamber from the inactive gas inlet port 101 and purges a reaction gas flowing into the lower portion from the susceptor surface.

At least three substrate lift pins 87 are provided for supporting the semiconductor substrate 93 on the susceptor 81. A step 102 is provided at the tip of the substrate lift pin 87. The circumference portion of the semiconductor 93 engages with the step 102 to support the semiconductor substrate 93 (See FIG. 10). Preferably, the width of the step 102 which the edge of the semiconductor substrate 93 contacts is less than 3 mm.

The pressing elastic material 94 comprises preferably a conical spring, but other spring material can also be used.

As shown in FIG. 8, when the semiconductor substrate 93 is transferred, the floating elastic material 88 presses the disk 89 onto the bottom surface of the susceptor 81 by elasticity. In this structure, the substrate lift pin 87 protrudes from the susceptor surface and can receive the semiconductor substrate 93 with the step 102 at its tip. The step 102 not only functions as a guide when the semiconductor substrate is transferred, but also functions to prevent the substrate from sliding during the processing.

Figure 9:
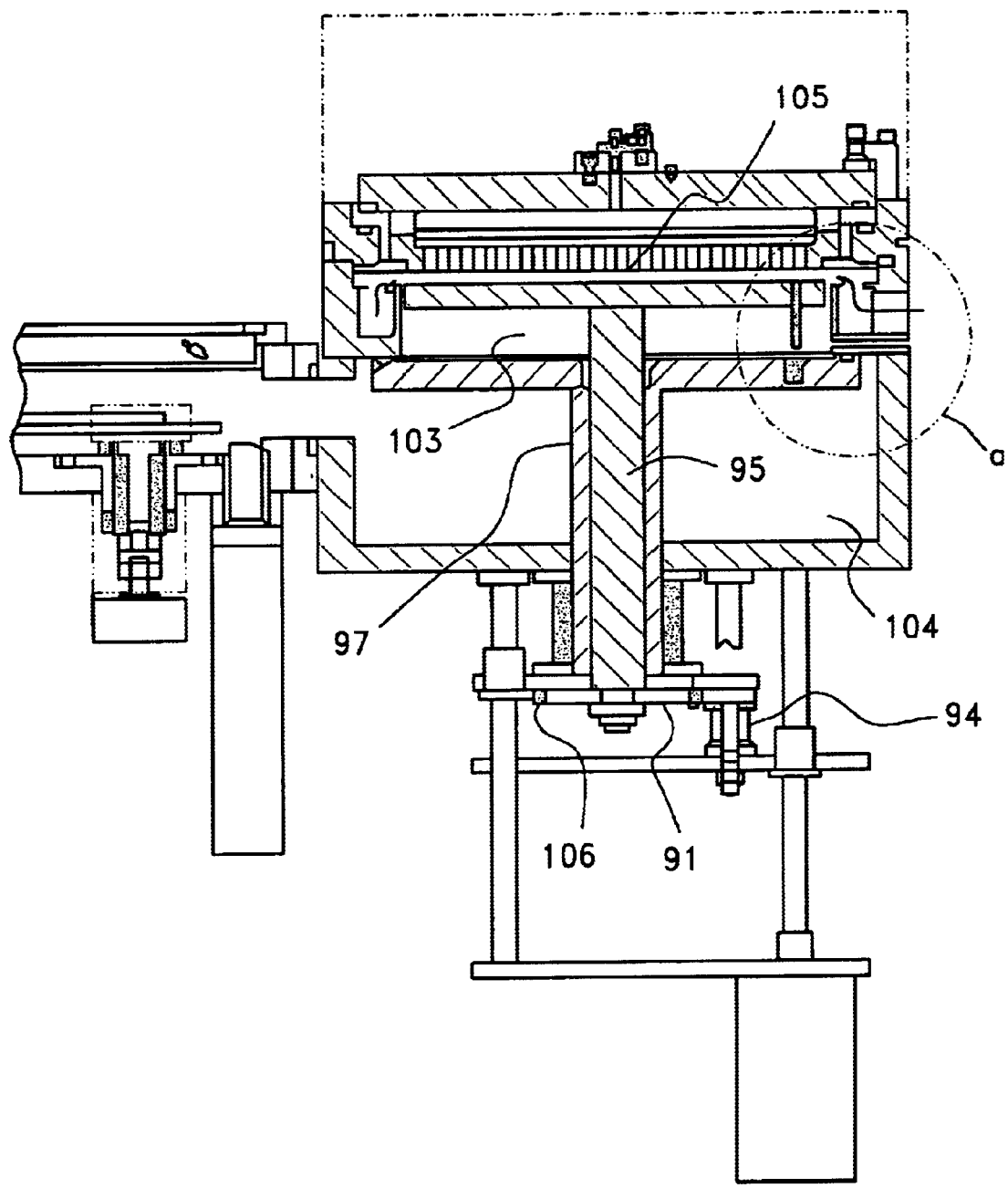
FIG. 9 is a schematic cross section of a reactor unit according to the present invention, depicting a semiconductor substrate being processed.
Figure 10:
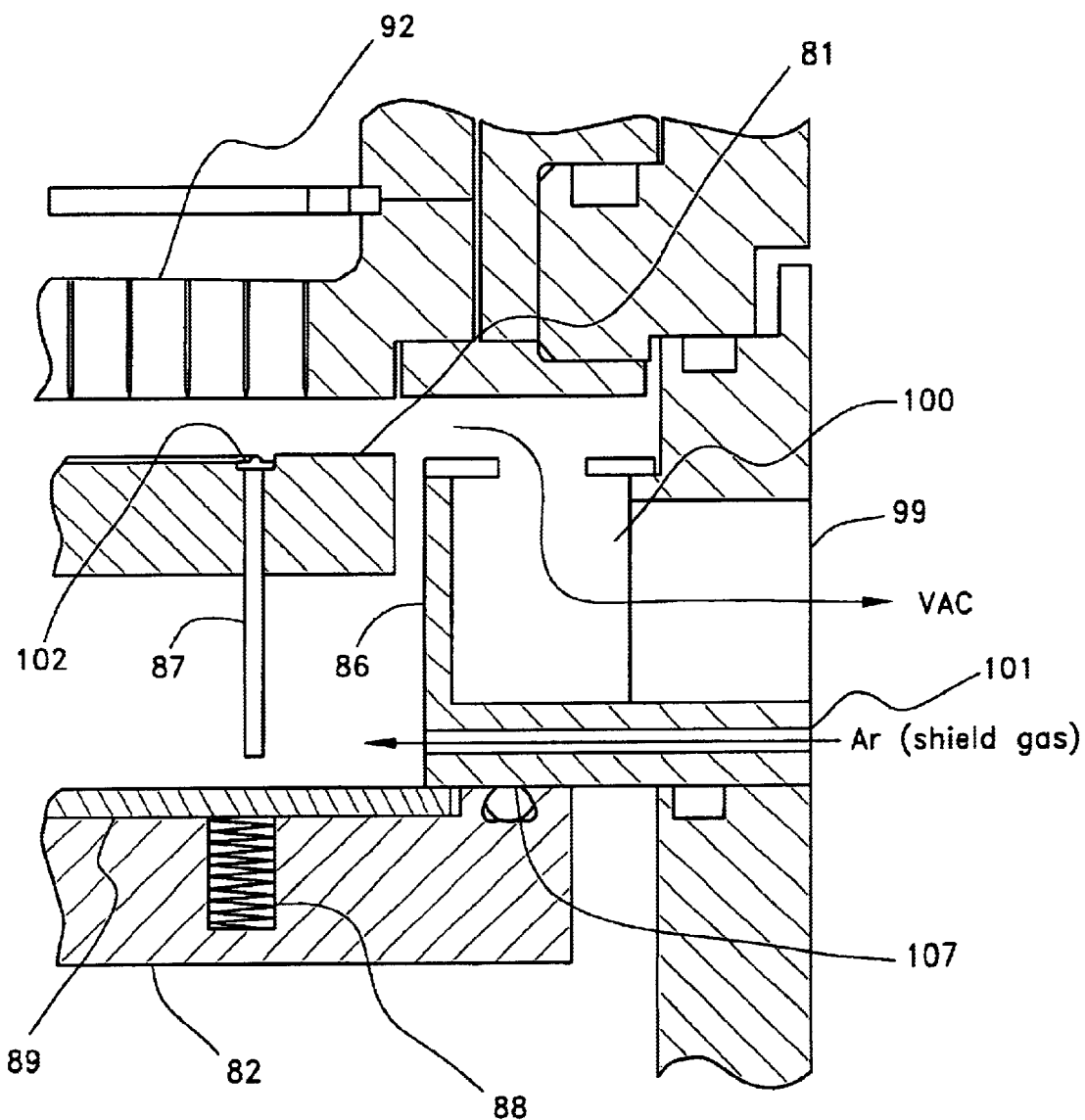
FIG. 10 is an enlarged view of the area a shown in FIG. 9.

FIG. 9 shows a positional relation of each element when the semiconductor substrate is processed. FIG. 10 is an enlarged view of the area a in the FIG. 9. The ball screw 83 rotates by the driving means 85. At the same time, the elevating plate 84 rises and thrust is transmitted to the slide plate 96 through the pressing elastic material 94. As the slide plate 94 rises, the cylindrical shaft 97 and the susceptor shaft 95 rise and the bellows 98 contract.

The protruding periphery of the seal plate 82 shortly contacts the seal surface 10 on the bottom of the duct means 86 and forming a seal. In this structure, the interior of the reactor 80 is divided into a transfer chamber 104 and a processing chamber 103. When the seal plate is sealed, the periphery of the disk 89 is held by the bottom surface of the duct means 86 and a portion more inward than the protruding portion of the seal plate 82. This eliminates a gap between the disk 89 and the seal plate 82. At the same time, the floating elastic material 88 contracts and is taken completely into the concave portion provided on the surface of the seal plate 82.

In a sealed position, the tip of the substrate lift pin 87 descends to a position of the susceptor surface level or lower than the susceptor surface level. This places the semiconductor substrate 93 on the surface of the susceptor 81. A small reaction zone 105 is formed between the showerhead 92 and the semiconductor substrate 93. An interval between the showerhead 92 and the semiconductor substrate 93 is adjusted independently of the seal plate 82 by raising, lowering or tilting the susceptor interval-adjusting plate 91. The adjustment is done by rotating multiple adjusting screws 106 attached to the susceptor interval-adjusting plate 91.

With the elevating plate 84 further rising and the pressed elastic material 94 pressed by preferably 1 mm to 3 mm, the seal plate 82 is sealed more securely. The periphery of the seal plate 82 is pressed against the seal surface 107 of the duct means 86 by elasticity. This achieves appropriate sealing force. By observing how much the pressing elastic material 94 is displaced, whether secure seal is achieved or not can be confirmed.

After completion of final pressing of the seal plate 82, gas inside the processing chamber 103 is evacuated via a gas passage 100 of the duct means 86 through the exhaust port 99 to the outside. At the same time, argon gas is brought in from the inactive gas inlet port 101. A reaction gas is subsequently brought in from the showerhead 92 and processing begins.

A reactor unit according to the above embodiment of the present invention makes it possible to reduce the size of a reaction chamber and to shorten time for deposition and cleaning. Additionally, sealing of a through hole of the substrate lift pin is eliminated. Furthermore, the embodiment provides a simple seal structure, with which secure sealing can be achieved.

Figure 12B:
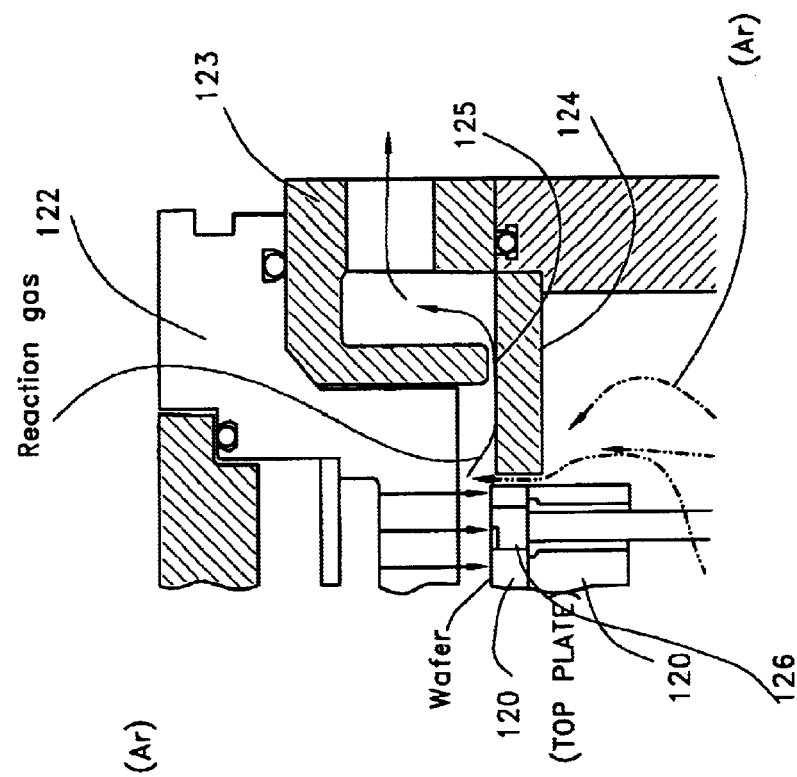
FIG. 12(b) is an enlarged view of the area b shown in FIG. 12(a).
Figure 12A:
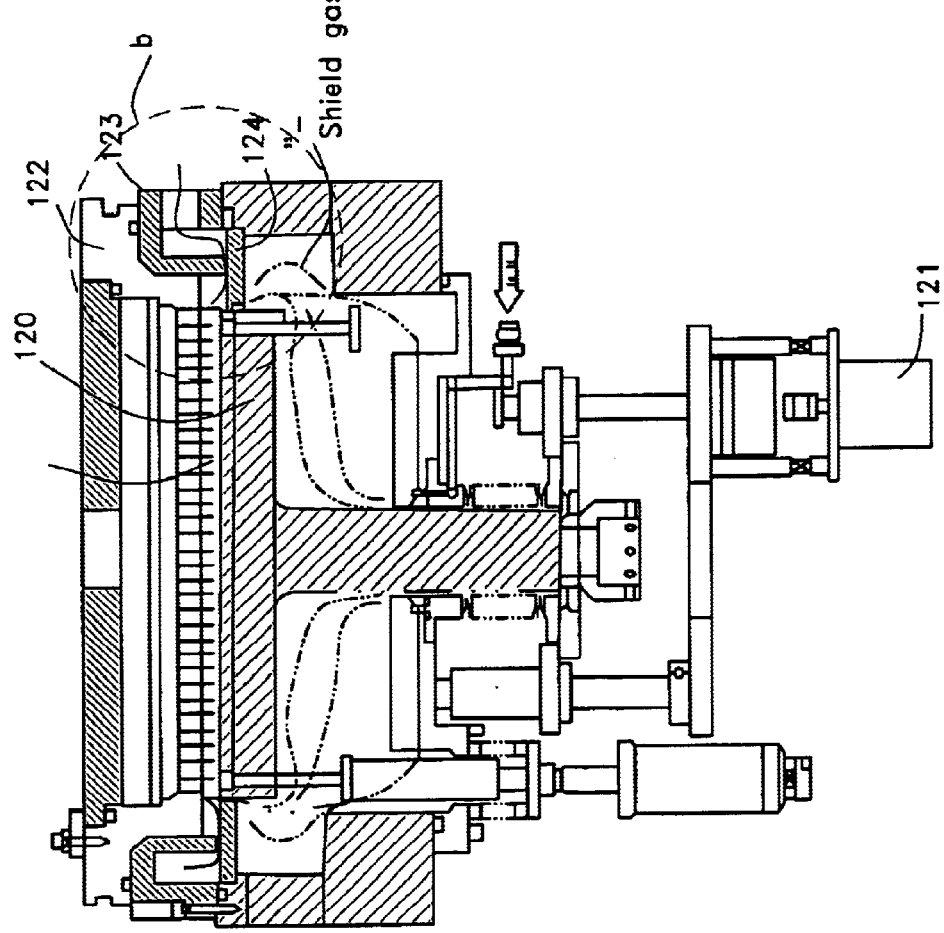
FIG. 12(a) is a cross section of another reactor unit according to the present invention.

Another embodiment of a reactor unit according to the present invention is described. FIGS. 12(A) and (B) show another embodiment of a reactor unit according to the present invention.

A reactor unit in another embodiment comprises a susceptor 120 on which semiconductor substrates are placed, an elevating means 121 for moving the susceptor in a vertical direction, a showerhead 122 provided on the ceiling of the reactor for bringing in gas, a duct means 123 provided near the showerhead 122 and circularly along the surface of an internal wall of the reactor, and a circular baffle plate 124 sharing the same shaft with the duct means 123 and provided to create a slight gap 125 at the bottom surface of the duct means and a slight gap 126 along the periphery of the susceptor when a film is formed. A reaction gas is exhausted from the gap 125 formed between the baffle plate 124 and the duct means 123. An inactive gas (preferably, Ar or He) flows from the bottom to the top through the gap 126 formed between the baffle plate 124 and the susceptor 120. Purging by the inactive gas prevents a reaction gas or plasma (in the case of PE-CVD) from penetrating below the susceptor. The baffle plate 124 and the duct means 123 preferably comprise insulators, preventing unnecessary deposition.

Another embodiment can reduce the size of a reaction zone further as compared with the preferred embodiment.

Conventional techniques similar to the present invention are now described and differences between them are examined. First, differences between Japanese Patent Laid-open No.10-30183 ("Conventional Technique 1") and the present invention are discussed. In the Conventional Technique 1, an ashing apparatus similar to the present invention is mentioned. A transfer mechanism inside a load lock chamber is characterized in that a hand unit holding a semiconductor substrate is taken into and out from a processing chamber by rotating or moving an arm in a straight line.

In an embodiment mentioned in the Conventional Technique 1 for rotating the arm, a semiconductor substrate is transferred into a processing chamber by drawing an arc around the rotating shaft of the arm. In contrast, in the semiconductor-manufacturing apparatus according to the present invention, a semiconductor substrate is transferred in a straight line.

Additionally, in an embodiment mentioned in the Conventional Technique 1 for moving the arm in a straight line, a semiconductor substrate is transferred by a slide shaft. In contrast, in the substrate transfer mechanism according to the present invention, a semiconductor substrate is transferred by an arm shaft.

Furthermore, a reactor unit in the Conventional Technique 1 is not configured as a cluster. In contrast, in the semiconductor-manufacturing apparatus according to the present invention, a reactor unit is modularized and can be configured as a cluster. One of the characteristics of the present invention is that modularized reactor units can be configured as a cluster through AFEs.

As described above, it can be seen that the apparatus space and dead space are larger in the Conventional Technique 1 as compared with the present invention. According to the present invention, a small capacity of less than 10 L can be realized for a load lock chamber accommodating a substrate with a diameter of 300 mm.

Secondly, differences between Japanese Patent Laid-open No.10-154739 ("Conventional Technique 2") and the present invention are discussed. In the Conventional Technique 2, disclosed is a substrate-processing apparatus comprising (a) a load lock chamber, (b) a transfer chamber, (c) more than one reactors, each being connected to the transfer chamber and having multiple (virtually two) processing zones, and (d) a first substrate-handling member provided inside the transfer chamber. The first substrate-handling member possesses multiple substrate-handling blades virtually on the same plane, which simultaneously transfer multiple (virtually two) semiconductor substrates between a load lock chamber and more than one reactors, and which simultaneously moves semiconductor substrates to separate reactors. A reaction gas is distributed from more than one gas source to each processing zone (virtually two) inside the reactor. Gas in each processing zone (virtually two) is discharged outside the reactor using a single pump.

First, the substrate-processing apparatus mentioned in the Conventional Technique 2 possesses a transfer chamber and a substrate-handling member provided inside the transfer chamber. In contrast, the semiconductor-manufacturing apparatus according to the present invention does not possess a transfer chamber, and the load lock chamber is directly connected with the reactor.

Secondly, the substrate-processing apparatus mentioned in the Conventional Technique 2 possesses multiple substrate-handling blades provided virtually on the same plane inside the same chamber. In contrast, the semiconductor-manufacturing apparatus according to the present invention possesses a substrate transfer mechanism independently provided inside each load lock chamber.

Thirdly, in the substrate-processing apparatus mentioned in the Conventional Technique 2, a unit comprising a reactor and a load lock chamber is not modularized. In contrast, in the semiconductor-manufacturing apparatus according to the present invention, a unit comprising a reactor and a load lock chamber is modularized so that at least two units are adjacently connected.

Fourthly, in the substrate-processing apparatus mentioned in the Conventional Technique 2, a gas flow is divided simply by a T-shaped joint. In contrast, in the semiconductor-manufacturing apparatus according to the present invention, a flow divider, which has capability to distribute a gas flow of 0 to 10 SLM inputted on the primary side in equal amounts to the secondary side, is used for dividing a gas flow. Additionally, the substrate-processing apparatus mentioned in the Conventional Technique 2 possesses two processing zones inside one reactor, and gas is discharged using a single pump after combining exhaust ports of the processing zones inside the reactor. In contrast, in the semiconductor-manufacturing apparatus according to the present invention, each processing zone inside the reactor is independent and gas inside each reactor is discharged using a single pump by controlling pressure for each reactor using an APC, etc.

By using this independent pressure control and the above-mentioned flow divider with which a gas flow is divided equally, deposition can be independently controlled in the same manner as in the case where a gas line for each reactor is used. Furthermore, the semiconductor-manufacturing apparatus according to the present invention possesses a gas stop valve and a vacuum exhaust valve for each reactor. Even though the configuration is one gas line for two reactors, processing can be performed using one reactor only.

As discussed above, the semiconductor-manufacturing apparatus mentioned in the Conventional Techniques 1 and 2 and the semiconductor-manufacturing apparatus according to the present invention differ in their apparatus configurations and effects.

It will be understood by those of skill in the art that numerous and various modifications can be made without departing from the spirit of the present invention. Therefore, it should be clearly understood that the forms of the present invention are illustrative only and are not intended to limit the scope of the present invention.

What is claimed is:

1. A semiconductor processing module adapted to be connected to an atmospheric robot unit, comprising:
    (a) multiple single-wafer processing units disposed side by side, each unit comprising:
        a reactor for treating a semiconductor substrate, said reactor having a pressure control valve in a gas exhaust line provided with a vacuum exhaust valve; and
        at least one load lock chamber for transferring the semiconductor substrate into and from the reactor in a vacuum, said load lock chamber having a front end and a rear end, said rear end being connected immediately to said reactor via a front gate valve, said front end being adapted to be connected to the atmospheric robot unit via an end gate valve, said load lock chamber comprising a vacuum robot having linked arms with one revolving shaft for transferring the semiconductor substrate into and from said reactor by straight movement through the front gate valve, the side-by-side arrangement of the multiple units being such that the atmospheric robot unit can access the multiple units via their end gate valves by movements parallel to one direction; and
    (b) a single gas supply system common to said multiple units, connected to each reactor and said load lock chamber, wherein gas flow of each reactor is independently controlled and a reactor-to-reactor difference in processing is compensated for by the pressure control valve provided for each reactor.

2. The semiconductor processing module according to claim 1, wherein the pressure control valve is an auto pressure control (APC) butterfly valve.

3. The semiconductor processing module according to claim 1, wherein said load lock chambers communicate with each other through a manifold connecting a lower portion of each load lock chamber, whereby vacuum operation is controlled as one load lock chamber.

4. The semiconductor processing module according to claim 1, which is composed of two single-wafer processing units.

5. The semiconductor processing module according to claim 1, wherein each unit has two load lock chambers, one chamber being placed on top of the other chamber, one of said chambers transferring the semiconductor substrate into the reactor in a vacuum, the other chamber transferring the semiconductor substrate from the reactor in a vacuum.

6. The semiconductor processing module according to claim 1, wherein the gas supply system is provided with a flow divider for supplying gas equally to each reactor.

7. The semiconductor processing module according to claim 6, further comprising a gas stop valve for each reactor between said flow divider and each reactor.

8. The semiconductor processing module according to claim 1, further comprising a vacuum exhaust valve for each reactor between the pressure control valve and the reactor.

9. The semiconductor processing module according to claim 1, wherein the gas supply system is provided with a mass flow controller for each reactor.

10. The semiconductor processing module according to claim 1, wherein the gas exhaust system is common to the respective reactors.

11. The semiconductor processing module according to claim 1, further comprising one RF generator and a switch for electrically connecting said RF generator and one of the reactors, wherein deposition and cleaning are alternately performed in the respective reactors.

12. A semiconductor processing module adapted to be connected to an atmospheric robot unit, comprising:
    (i) multiple single-wafer processing units disposed side by side, each unit comprising:
        a reactor for treating a semiconductor substrate, said reactor having a pressure control valve in a gas exhaust line; and
        at least one load lock chamber for transferring the semiconductor substrate into and from the reactor in a vacuum, said load lock chamber having a front end and a rear end, said rear end being connected immediately to said reactor via a front gate valve, said front end being adapted to be connected to the atmospheric robot unit via an end gate valve, said load lock chamber comprising a vacuum robot having linked arms with one revolving shaft for transferring the semiconductor substrate into and from said reactor by straight movement through the front gate valve; and (ii) a gas supply system common to said multiple units, wherein gas flow of each reactor is controlled by the pressure control valve provided in each reactor, wherein the reactor comprises:

a susceptor for placing a semiconductor substrate thereon;

a seal plate provided below and coaxially with said susceptor, said seal plate having a larger diameter than the susceptor and a seal surface along its periphery;

an elevating/descending device for moving said susceptor and said seal in a vertical direction;

a showerhead provided on a ceiling of said reactor for introducing gas; and a duct member provided near said showerhead and having a circular projection formed along an inner wall of said reactor, wherein:

(a) at a position where the susceptor and the seal plate elevate and the seal surface of the seal plate contacts the circular projection of the duct member, the interior of the reactor is divided by the seal plate into an upper reaction compartment and a lower compartment, in which reaction compartment a substrate on the susceptor is treated; and (b) at a position where the susceptor and the seal plate descend, a substrate is transferred via the front gate valve.

13. The semiconductor processing module according to claim 12, wherein the reactor further comprises:

at least three substrate lift pins passing through said susceptor for supporting a substrate over said susceptor;

a disk for supporting said substrate lift pins, which is provided between the susceptor and the seal plate and coaxially with said susceptor, said disk having a diameter smaller than the seal plate but larger than the inner diameter of the circular projection; and a floating elastic material having an upper end supporting said disk from its back and a lower end inserted in a recess formed in said seal plate, wherein when said seal plate is sealed to said circular projection of the duct member, said disk is also held by the circular projection to push said floating elastic material back in the recess of the seal plate, and said substrate lift pins descend to a position where the tip of each substrate lift pin is at a level the same as or lower than a susceptor surface.

14. The semiconductor processing module according to claim 13, wherein the seal plate is provided with a pressing elastic material for securing the seal between the seal surface of the seal plate and the circular projection.

15. The semiconductor processing module according to claim 12, further comprising a susceptor height adjusting plate for adjusting the distance between the susceptor and the seal plate, thereby adjusting the distance between the showerhead and the susceptor when the susceptor and the seal plate elevate and the seal plate seals the circular projection of the duct, said susceptor height adjusting plate being installed along and coaxially with a susceptor shaft.

16. A semiconductor processing module adapted to be connected to an atmospheric robot unit, comprising:

(i) multiple single-wafer processing units disposed side by side, each unit comprising:

a reactor for treating a semiconductor substrate, said reactor having a pressure control valve in a gas exhaust line; and at least one load lock chamber for transferring the semiconductor substrate into and from the reactor in a vacuum, said load lock chamber having a front end and a rear end, said rear end being connected immediately to said reactor via a front gate valve, said front end being adapted to be connected to the atmospheric robot unit via an end gate valve, said load lock chamber comprising a vacuum robot having linked arms with one revolving shaft for transferring the semiconductor substrate into and from said reactor by straight movement through the front gate valve; and (ii) a gas supply system common to said multiple units, wherein gas flow of each reactor is controlled by the pressure control valve provided in each reactor, wherein the reactor comprises:

a susceptor for placing a semiconductor substrate thereon;

an elevating/descending device for moving said susceptor in a vertical direction;

a showerhead provided on a ceiling of said reactor for introducing gas;

a duct member provided along said showerhead and formed along an inner wall of said reactor, said duct member projecting downward along said showerhead; and a circular baffle plate provided on the inner wall of said reactor immediately below the duct member, wherein a gap is formed between the circular baffle plate and a lower end of the duct member, said circular baffle plate having an inner diameter slightly larger than the susceptor, wherein:

(a) at a position where the susceptor elevates and is leveled with the circular baffle plate, the interior of the reactor is divided into an upper reaction compartment and a lower compartment, in which reaction compartment a substrate on the susceptor is treated, wherein an exhaust gas is discharged from the upper reaction compartment through the gap formed between the circular baffle plate and the duct member, and a shield gas is provided into the reaction compartment from the lower compartment through a gap formed between the susceptor and the circular baffle plate; and (b) at a position where the susceptor descends, a substrate is transferred via the front gate valve.

17. The semiconductor processing module according to claim 16, wherein said duct member and said baffle plate are made of an insulation material.

18. A semiconductor processing apparatus comprising at least one module of claim 1 and an atmospheric robot unit including an atmospheric robot for transferring a substrate into and from each reactor.

19. The semiconductor processing apparatus according to claim 18, wherein the atmospheric robot unit has a sliding shaft in parallel to the load lock chambers, on which shaft the atmospheric robot slides to position in front of each load lock chamber.

20. The semiconductor processing apparatus according to claim 18, wherein multiple modules are aligned side by side in a line.

21. The semiconductor processing apparatus according to claim 20, wherein the multiple modules are disposed facing each other via a common atmospheric robot unit comprising an atmospheric robot for transferring a substrate into and from each load lock chamber.

22. The semiconductor processing apparatus according to claim 21, further comprising an atmospheric transport unit which is connected to the atmospheric robot unit and a loading port, wherein the atmospheric transport unit transfers a substrate or substrates between the atmospheric robot and the loading port.

23. The semiconductor processing apparatus according to claim 22, which includes the loading port comprising a cassette and/or an inspection unit.

24. The semiconductor processing apparatus according to claim 22, wherein the atmospheric transport unit comprises:
    a slot and an arm shaft for collectively transferring multiple substrates;
    an elevating/descending shaft; and
    a rotating shaft for transferring substrates between the loading port and the atmospheric robot,
    wherein said atmospheric transport unit collectively moves multiple substrates to a position where a substrate is transferred between the atmospheric transport unit and the atmospheric robot while the atmospheric robot does not slide on the sliding shaft.

25. A semiconductor processing module adapted to be connected to an atmospheric robot unit, comprising:
    (a) multiple single-wafer processing units disposed side by side, each unit comprising:
        a reactor for treating a semiconductor substrate, said reactor having a pressure control valve in a gas exhaust line provided with a vacuum exhaust valve; and
        a load lock chamber for transferring the semiconductor substrate into and from the reactor in a vacuum and comprising a vacuum robot for transferring the semiconductor substrate into and from said reactor by straight movement, the side-by-side arrangement of the multiple units being such that an atmospheric robot unit can access each load lock chamber by a movement in a direction in which the vacuum robot transfers the substrate;
    (b) a single gas supply system common to said reactors, comprising a gas stop valve provided for each reactor; and
    (c) a single exhaust system common to said reactors, wherein gas flow of each reactor is independently controlled and a reactor-to-reactor difference in processing is compensated for by the pressure control valve, the vacuum exhaust valve, and the gas stop valve.

26. The semiconductor processing module according to claim 25, wherein the gas supply system is provided with a flow divider for supplying gas equally to each reactor.

27. A semiconductor processing module adapted to be connected to an atmospheric robot unit, comprising:
    (a) multiple single-wafer processing units disposed side by side, each unit comprising:
        a reactor for treating a semiconductor substrate, said reactor having a pressure control valve in a gas exhaust line provided with a vacuum exhaust valve; and
        a load lock chamber for transferring the semiconductor substrate into and from the reactor in a vacuum and comprising a vacuum robot for transferring the semiconductor substrate into and from said reactor by straight movement, the side-by-side arrangement of the multiple units being such that an atmospheric robot unit can access each load lock chamber by a movement in a direction in which the vacuum robot transfers the substrate;
    (b) a single gas supply system common to said reactors, comprising a gas box to which a cleaning gas line and a processing gas line are connected, and from which gases are supplied to each reactor via a gas supply line provided with a gas stop valve; and
    (c) an exhaust system for each reactor, wherein gas flow of each reactor is independently controlled and a reactor-to-reactor difference in processing is compensated for by the pressure control valve, the vacuum exhaust valve, and the gas stop valve.

28. The semiconductor processing module according to claim 27, wherein a gas supply line is extended from the gas box to the load lock chambers of the multiple units.

* * * * *